United States Patent
Yamade et al.

(10) Patent No.: US 8,951,899 B2
(45) Date of Patent: Feb. 10, 2015

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Naoto Yamade, Isehara (JP); Junichi Koezuka, Tochigi (JP); Miki Suzuki, Yokohama (JP); Yuichi Sato, Isehara (JP)

(73) Assignee: Semiconductor Energy Laboratory, Atsugi-shi, Kanagawa-ken (JP)

( * ) Notice: Subject to any disclaimer, the term of this patent is extended or adjusted under 35 U.S.C. 154(b) by 39 days.

(21) Appl. No.: 13/681,888

(22) Filed: Nov. 20, 2012

(65) Prior Publication Data

US 2013/0137255 A1    May 30, 2013

(30) Foreign Application Priority Data

Nov. 25, 2011    (JP) .................................. 2011-257633

(51) Int. Cl.
*H01L 21/425* (2006.01)
*H01L 21/336* (2006.01)
(Continued)

(52) U.S. Cl.
CPC .......... *H01L 21/265* (2013.01); *H01L 29/7869* (2013.01); *H01L 29/66742* (2013.01); *H01L 29/78603* (2013.01); *H01L 27/1225* (2013.01)
USPC .......................................... 438/530; 438/197

(58) Field of Classification Search
USPC ...................................................... 438/530
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Lex Malsawma
(74) *Attorney, Agent, or Firm* — Eric J. Robinson; Robinson Intellectual Property Law Office, P.C.

(57) ABSTRACT

To provide a semiconductor device including an oxide semiconductor which is capable of having stable electric characteristics and achieving high reliability, by a dehydration or dehydrogenation treatment performed on a base insulating layer provided in contact with an oxide semiconductor layer, the water and hydrogen contents of the base insulating layer can be decreased, and by an oxygen doping treatment subsequently performed, oxygen which can be eliminated together with the water and hydrogen is supplied to the base insulating layer. By formation of the oxide semiconductor layer in contact with the base insulating layer whose water and hydrogen contents are decreased and whose oxygen content is increased, oxygen can be supplied to the oxide semiconductor layer while entry of the water and hydrogen into the oxide semiconductor layer is suppressed.

20 Claims, 14 Drawing Sheets

(51) Int. Cl.
  *H01L 21/265* (2006.01)
  *H01L 29/786* (2006.01)
  *H01L 29/66* (2006.01)
  *H01L 27/12* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,049,225 B2 | 11/2011 | Yamazaki et al. |
| 8,129,719 B2 | 3/2012 | Yamazaki et al. |
| 8,274,077 B2 | 9/2012 | Akimoto et al. |
| 8,461,007 B2 * | 6/2013 | Yamazaki ............... 438/287 |
| 8,530,289 B2 | 9/2013 | Yamazaki |
| 8,546,225 B2 * | 10/2013 | Yamazaki ............... 438/287 |
| 8,669,148 B2 | 3/2014 | Yamazaki |
| 8,785,242 B2 | 7/2014 | Yamazaki et al. |
| 8,822,264 B2 | 9/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0136301 A1 | 6/2011 | Yamazaki et al. |
| 2011/0163311 A1 | 7/2011 | Akimoto et al. |
| 2011/0212569 A1 | 9/2011 | Yamazaki et al. |
| 2011/0263082 A1 | 10/2011 | Yamazaki |
| 2011/0263083 A1 * | 10/2011 | Yamazaki ............... 438/161 |
| 2011/0263084 A1 * | 10/2011 | Yamazaki ............... 438/161 |
| 2011/0263085 A1 * | 10/2011 | Yamazaki ............... 438/161 |
| 2011/0263091 A1 * | 10/2011 | Yamazaki ............... 438/287 |
| 2012/0051117 A1 | 3/2012 | Yamazaki et al. |
| 2012/0319183 A1 * | 12/2012 | Yamazaki et al. ............ 257/288 |
| 2013/0009209 A1 * | 1/2013 | Yamazaki ............... 257/192 |
| 2014/0170809 A1 | 6/2014 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2007-096055 A | 4/2007 |
| JP | 2007-123861 A | 5/2007 |
| JP | 2008-060419 A | 3/2008 |
| JP | 2009-224479 A | 10/2009 |
| JP | 2011-181801 A | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimuzuka.N et al., "Synthesis and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGaO4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '90 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID Interational Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09 : Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Supttering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshps, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al,, "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layers,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Worshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science and Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

METHOD FOR MANUFACTURING SEMICONDUCTOR DEVICE

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

A technique by which a transistor is formed with a semiconductor thin film formed over a substrate having an insulating surface has been attracting attention. The transistor is applied to a wide range of semiconductor electronic devices such as an integrated circuit (IC) and an image display device (also simply referred to as a display device). A silicon-based semiconductor material is widely known as a material for a semiconductor thin film applicable to the transistor. As another material, an oxide semiconductor has been attracting attention.

For example, a technique is disclosed by which a transistor is manufactured using zinc oxide or an In—Ga—Zn-based oxide as an oxide semiconductor (see Patent Documents 1 and 2).

It has been pointed out that hydrogen behaves as a carrier supply source in an oxide semiconductor. Therefore, some measures need to be taken to prevent hydrogen from entering the oxide semiconductor at the time of forming an oxide semiconductor. Further, a technique is disclosed by which variation of a threshold voltage is suppressed by reducing the hydrogen content of not only the oxide semiconductor but also a gate insulating film in contact with the oxide semiconductor (see Patent Document 3).

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2009-224479

SUMMARY OF THE INVENTION

Moreover, as well as hydrogen, an oxygen vacancy contained in an oxide semiconductor behaves as a carrier supply source. The oxygen vacancy in the oxide semiconductor serves as a donor to generate an electron that is a carrier in the oxide semiconductor. A large number of oxygen vacancies in an oxide semiconductor included in a channel formation region of a transistor leads to generation of electrons in the channel formation region and is thus a factor causing the shift of the threshold voltage of the transistor to the negative direction.

In view of the above problem, an object of one embodiment of the present invention is to provide a method for manufacturing a semiconductor device including an oxide semiconductor, which is capable of having stable electric characteristics and achieving high reliability.

In a method for manufacturing a semiconductor device according to one embodiment of the present invention, in which an oxide semiconductor layer is used for a channel formation region, a base insulating layer provided in contact with the oxide semiconductor layer is dehydrated or dehydrogenated by a heat treatment and an oxygen doping treatment is subsequently performed on the dehydrated or dehydrogenated base insulating layer. By a heat treatment for the purpose of removing a hydrogen atom (hereinafter also referred to as a dehydration or dehydrogenation treatment), which is performed on the base insulating layer, the water and hydrogen contents of the base insulating layer can be reduced. However, oxygen can be eliminated together with the water and hydrogen by the heat treatment; therefore, it is necessary to supply oxygen to the base insulating layer by the oxygen doping treatment subsequently performed. By formation of the oxide semiconductor layer in contact with the base insulating layer whose water and hydrogen contents are decreased and whose oxygen content is increased, oxygen can be supplied to the oxide semiconductor layer while entry of the water and hydrogen into the oxide semiconductor layer is suppressed.

A doping treatment with oxygen or a rare gas is preferably performed on the base insulating layer before the dehydration or dehydrogenation treatment. By introduction of oxygen or a rare gas into the base insulating layer, a bond between hydrogen and an element included in the base insulating layer (e.g., silicon) or a bond between a hydroxyl group and the element are cleaved, the hydrogen or hydroxyl group reacts with oxygen, and then water is generated. Accordingly, hydrogen or a hydroxyl group contained in the base insulating layer can be eliminated easily as water by the subsequent heat treatment for the purpose of a dehydration or dehydrogenation treatment. Further, in the heat treatment for the purpose of a dehydration or dehydrogenation treatment, the temperature can be lowered or the processing time can be shortened.

Note that the heat treatment and/or the oxygen doping treatment performed on the base insulating layer may be repeated a plurality of times. After formation of the oxide semiconductor layer, the oxide semiconductor layer may be subjected to a heat treatment for the purpose of a dehydration or dehydrogenation treatment thereof. The heat treatment performed on the oxide semiconductor layer is preferably performed before the oxide semiconductor layer is processed into an island shape.

One embodiment of the present invention is a method for manufacturing a semiconductor device including the following steps: a step of forming a base insulating layer over an insulating surface; a step of removing water or hydrogen contained in the base insulating layer by a heat treatment performed on the base insulating layer and then supplying oxygen to the base insulating layer by an oxygen doping treatment performed on the base insulating layer; a step of forming an oxide semiconductor layer over the base insulating layer subjected to the heat treatment and the oxygen doping treatment; a step of forming a gate insulating layer over the oxide semiconductor layer; and a step of forming a gate electrode layer over the oxide semiconductor layer with the gate insulating layer provided therebetween.

Another embodiment of the present invention is a method for manufacturing a semiconductor device including the following steps: a step of forming a base insulating layer over an insulating surface; a step of supplying oxygen to the base insulating layer by a first oxygen doping treatment performed on the base insulating layer; a step of removing water or hydrogen contained in the base insulating layer by a heat treatment performed on the base insulating layer and then supplying oxygen to the base insulating layer by a second oxygen doping treatment performed on the base insulating layer; a step of forming an oxide semiconductor layer over the base insulating layer subjected to the first oxygen doping treatment, the heat treatment, and the second oxygen doping treatment; a step of forming a gate insulating layer over the oxide semiconductor layer; and a step of forming a gate electrode layer over the oxide semiconductor layer with the gate insulating layer provided therebetween.

Another embodiment of the present invention is a method for manufacturing a semiconductor device including the following steps: a step of forming a base insulating layer over an insulating surface; a step of removing water or hydrogen contained in the base insulating layer by a first heat treatment performed on the base insulating layer and then supplying oxygen to the base insulating layer by an oxygen doping treatment performed on the base insulating layer; a step of forming an oxide semiconductor layer over the base insulating layer subjected to the first heat treatment and the oxygen doping treatment; a step of supplying oxygen to the oxide semiconductor layer from the base insulating layer by a second heat treatment performed on the oxide semiconductor layer; a step of forming an island-shaped oxide semiconductor layer by processing the oxide semiconductor layer; a step of forming a gate insulating layer covering the island-shaped oxide semiconductor layer; and a step of forming a gate electrode layer over the island-shaped oxide semiconductor layer with the gate insulating layer provided therebetween.

Another embodiment of the present invention is a method for manufacturing a semiconductor device including the following steps: a step of forming a base insulating layer over an insulating surface; a step of supplying oxygen to the base insulating layer by a first oxygen doping treatment performed on the base insulating layer; a step of removing water or hydrogen contained in the base insulating layer by a first heat treatment performed on the base insulating layer and then supplying oxygen to the base insulating layer by a second oxygen doping treatment performed on the base insulating layer; a step of forming an oxide semiconductor layer over the base insulating layer subjected to the first oxygen doping treatment, the first heat treatment, and the second oxygen doping treatment; a step of supplying oxygen to the oxide semiconductor layer from the base insulating layer by a second heat treatment performed on the oxide semiconductor layer; a step of forming an island-shaped oxide semiconductor layer by processing the oxide semiconductor layer; a step of forming a gate insulating layer covering the island-shaped oxide semiconductor layer; and a step of forming a gate electrode layer over the island-shaped oxide semiconductor layer with the gate insulating layer provided therebetween.

Further, in any of the above methods for manufacturing a semiconductor device, the base insulating layer is preferably formed by a plasma-enhanced chemical vapor deposition method.

According to one embodiment of the present invention, a semiconductor device including an oxide semiconductor, which is capable of having stable electric characteristics and achieving high reliability, can be provided.

DETAILED DESCRIPTION OF THE INVENTION

Figure 1A:
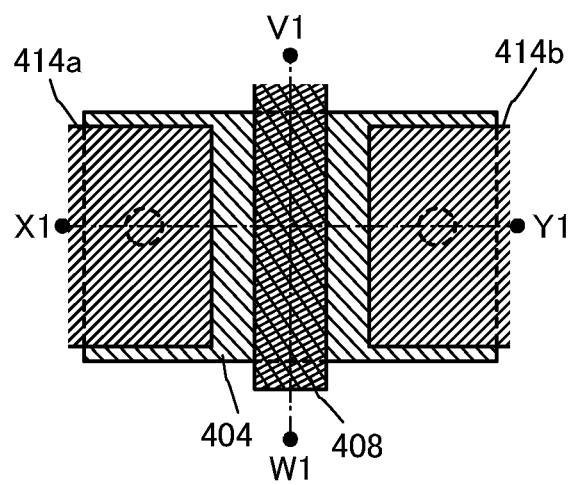
FIGS. 1A to 1C are a plan view and cross-sectional views of a semiconductor device according to one embodiment of the present invention.

Embodiments and an example of the invention disclosed in this specification are described in detail below with reference to the drawings. However, the invention disclosed in this specification is not limited to the following description, and it will be easily understood by those skilled in the art that modes and details thereof can be variously changed. Therefore, the invention disclosed in this specification is not construed as being limited to the description of the following embodiments and example. Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

In this specification, ordinal numbers such as "first" and "second are used in order to avoid confusion among components, and the terms do not limit the components numerically.

Embodiment 1

In this embodiment, a semiconductor device according to one embodiment of the present invention and a method for manufacturing the semiconductor device will be described with reference to FIGS. 1A to 1C and FIGS. 2A to 2E.

Figure 1C:
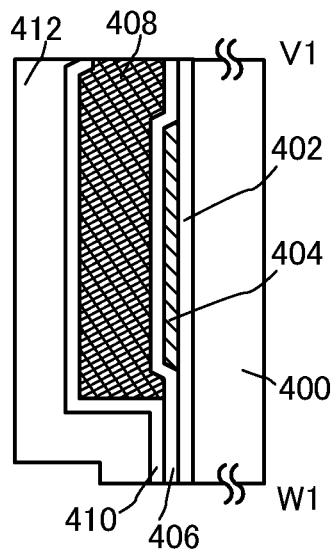
Figure 1B:
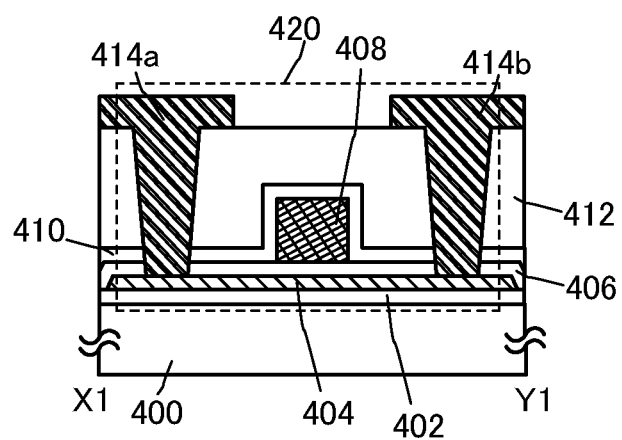

FIGS. 1A to 1C illustrate a structural example of a transistor 420. FIG. 1A is a plan view of the transistor 420, FIG. 1B is a cross-sectional view taken along the line X1-Y1 in FIG. 1A, and FIG. 1C is a cross-sectional view taken along the line V1-W1 in FIG. 1A. Note that in FIG. 1A, some components of the transistor 420 (e.g., an interlayer insulating layer 412) are not illustrated for clarity.

The transistor 420 illustrated in FIGS. 1A to 1C includes a base insulating layer 402 provided over a substrate 400, an oxide semiconductor layer 404 provided over the base insulating layer 402, a gate insulating layer 406 provided over the oxide semiconductor layer 404, a gate electrode layer 408 which overlaps with the oxide semiconductor layer 404 with the gate insulating layer 406 provided therebetween, and a source electrode layer 414a and a drain electrode layer 414b electrically connected to the oxide semiconductor layer 404. In addition, the transistor 420 may further include, as its components, an interlayer insulating layer 410 and an interlayer insulating layer 412 which are provided over the gate electrode layer 408.

In the transistor 420 illustrated in FIGS. 1A to 1C, the base insulating layer 402 is a base insulating layer whose water and hydrogen contents are decreased by a dehydration or dehydrogenation treatment and whose oxygen content is increased by a subsequent oxygen doping treatment. By formation of the oxide semiconductor layer 404 in contact with the base insulating layer 402 whose water and hydrogen contents are decreased and whose oxygen content is increased, the transistor 420 can have higher reliability.

An example of a method for manufacturing the transistor 420 illustrated in FIGS. 1A to 1C will be described below with reference to FIGS. 2A to 2E.

Figure 2A:
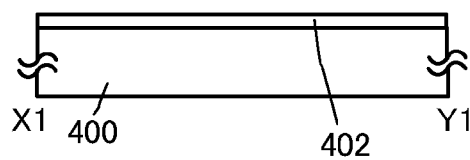
FIGS. 2A to 2E are cross-sectional views illustrating a method for manufacturing a semiconductor device according to one embodiment of the present invention.

First, the base insulating layer 402 is formed over the substrate 400 having an insulating surface (see FIG. 2A).

There is no particular limitation on a substrate that can be used as the substrate 400 having an insulating surface as long as it has at least heat resistance to withstand a heat treatment step performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or such a substrate provided with a semiconductor element can be used as the substrate 400.

Alternatively, the semiconductor device may be manufactured using a flexible substrate as the substrate 400. In order to manufacture a flexible semiconductor device, the transistor 420 including the oxide semiconductor layer 404 may be directly formed on a flexible substrate, or the transistor 420 including the oxide semiconductor layer 404 may be formed over a different manufacturing substrate and then separated and transferred to a flexible substrate. Note that in order to separate the transistor 420 including the oxide semiconductor layer from the manufacturing substrate and transfer it to the flexible substrate, a separation layer may be provided between the manufacturing substrate and the transistor 420 including the oxide semiconductor.

In this embodiment, the base insulating layer 402 is formed by a plasma-enhanced chemical vapor deposition (CVD) method. With a plasma-enhanced CVD method, time necessary for film formation (takt time) can be made shorter than that in the case of a sputtering method. Further, with a plasma-enhanced CVD method, variation in the plane of the base insulating layer 402 which is formed is smaller and entry of particles into the plane thereof occur less frequently than those in the case of a sputtering method. Therefore, it is effective to form the base insulating layer 402 by a plasma-enhanced CVD method particularly in the case where a large-sized substrate is used. Note that a low-temperature oxide (LTO) film may be used as the base insulating layer 402.

The base insulating layer 402 can have a single-layer or a layered structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, and gallium oxide, and a mixed material of any of these materials. Note that the base insulating layer 402 preferably has a single-layer structure or a layered structure including an oxide insulating film so that the oxide insulating film is in contact with an oxide semiconductor layer to be formed later. The base insulating layer 402 may also be amorphous.

Note that it is more difficult to reduce the hydrogen concentration in a film with a plasma-enhanced CVD method than with a sputtering method. Therefore, in this embodiment, a heat treatment for the purpose of removing a hydrogen atom (a dehydration or dehydrogenation treatment) is performed on the base insulating layer 402 after its formation.

The temperature of the heat treatment is higher than or equal to 250° C. and lower than or equal to 650° C., preferably higher than or equal to 450° C. and lower than or equal to 600° C. or lower than the strain point of the substrate. For example, the substrate is put in an electric furnace which is one of heat treatment apparatuses, and the heat treatment is performed on the base insulating layer 402 at 650° C. in a vacuum (reduced-pressure) atmosphere for an hour.

Note that the heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, a heat treatment is performed using a high-temperature gas. As the high-temperature gas, an inert gas which does not react with an object to be processed by the heat treatment, such as nitrogen or a rare gas like argon, is used. Note that in the case where a GRTA apparatus is used as the heat treatment apparatus, the substrate may be heated in an inert gas heated to high temperature of 650° C. to 700° C. because the heat treatment time is short.

The heat treatment can be performed under an atmosphere of nitrogen, oxygen, ultra-dry air (air in which the moisture content is less than or equal to 20 ppm, preferably less than or equal to 1 ppm, more preferably less than or equal to 10 ppb), or a rare gas (e.g., argon or helium). It is preferable that water, hydrogen, and the like be not contained in the above atmosphere of nitrogen, oxygen, ultra-dry air, the rare gas, or the like. Alternatively, it is preferable that the purity of nitrogen, oxygen, or the rare gas which is introduced into the heat treatment apparatus be set to be higher than or equal to 6N (99.9999%), more preferably higher than or equal to 7N (99.99999%) (i.e., the concentration of impurities is lower than or equal to 1 ppm, preferably lower than or equal to 0.1 ppm).

Figure 2B:
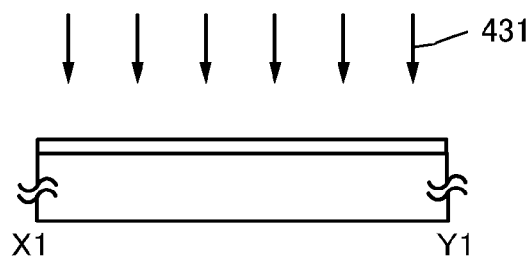

Next, a treatment for introducing oxygen 431 (also referred to as an oxygen doping treatment or an oxygen implanting treatment) is performed on the base insulating layer 402 subjected to the dehydration or dehydrogenation treatment (see FIG. 2B). At least any of an oxygen radical, ozone, an oxygen atom, and an oxygen ion (including a molecular ion and a cluster ion) is included in the oxygen 431. By the oxygen doping treatment performed on the base insulating layer 402 subjected to the dehydration or dehydrogenation treatment, oxygen can be contained in the base insulating layer 402, which enables oxygen which has eliminated in the above heat treatment to be compensated and also oxygen to be contained in either or both the oxide semiconductor layer 404 formed later or/and in the vicinity of the interface between the base insulating layer 402 and the oxide semiconductor layer 404.

As a method for introducing oxygen 431 into the base insulating layer 402, for example, an ion implantation method, an ion doping method, a plasma immersion ion implantation method, or a plasma treatment can be used. Note that as an ion implantation method, a gas cluster ion beam may be used. Oxygen may be introduced into the entire surface of the substrate 400 at a time. Alternatively, a linear ion beam may be used, for example. In the case of using a linear ion beam, relative movement (scanning) of the substrate or the ion beam enables the oxygen 431 to be introduced into the entire surface of the base insulating layer 402.

As a supply gas of the oxygen 431, a gas containing oxygen (O) can be used; for example, an $O_2$ gas, an $N_2O$ gas, a $CO_2$ gas, a CO gas, or an $NO_2$ gas can be used. Note that a rare gas (e.g., an Ar gas) may be contained in the supply gas of the oxygen.

For example, in the case where oxygen is introduced by an ion implantation method, the dosage of the oxygen 431 is preferably greater than or equal to $1 \times 10^{13}$ ions/cm$^2$ and less than or equal to $5 \times 10^{16}$ ions/cm$^2$, and it is preferable that the oxygen content of the base insulating layer 402 after the oxygen doping treatment be in substantial excess of that of the stoichiometric composition of the base insulating layer 402. For example, in the case where silicon oxide whose composition is represented by $SiO_x$ (x>0) is used, since a single crystal of silicon oxide is $SiO_2$, x is preferably greater than 2. Note that a region whose oxygen content exceeds that of the stoichiometric composition (hereinafter also referred to as "an oxygen-excess region") at least exist in part of the base insulating layer 402. The depth in the base insulating layer 402 at which oxygen is implanted can be controlled as appropriate.

Note that in the case where an oxide insulating layer is used as the base insulating layer 402, oxygen is one of the main components of the oxide insulating layer. Therefore, it is difficult to estimate the oxygen concentration in the oxide insulating layer accurately with Secondary Ion Mass Spectrometry (SIMS) or the like. That is, it is difficult to judge whether oxygen is intentionally implanted into the oxide insulating layer or not. Moreover, the same can be said for the case where excess oxygen contained in the base insulating layer 402 is supplied to the oxide semiconductor layer in a later step.

Incidentally, it is known that oxygen contains isotopes such as $^{17}O$ and $^{18}O$ and the proportions of $^{17}O$ and $^{18}O$ in all of the oxygen atoms in nature is about 0.038% and about 0.2%, respectively. That is to say, it is possible to measure the concentrations of these isotopes in the base insulating layer (or the oxide semiconductor layer) by a method such as SIMS; therefore, the oxygen concentration in the base insulating layer (or the oxide semiconductor layer) may be able to be estimated more accurately by measuring the concentrations of these isotopes. Thus, the concentrations of these isotopes may be measured to determine whether oxygen is intentionally implanted into the base insulating layer (or the oxide semiconductor layer).

In the case of the transistor including an oxide semiconductor, supply of oxygen from the base insulating layer to the oxide semiconductor layer enables reduction of an interface state density at the interface between the oxide semiconductor layer and the base insulating layer. As a result, carrier trapping at the interface between the oxide semiconductor layer and the base insulating layer due to the operation of a transistor, or the like can be suppressed; thus, a highly reliable transistor can be obtained.

Further, electric charges are in some cases generated owing to oxygen vacancies in the oxide semiconductor layer. In general, parts of oxygen vacancies in an oxide semiconductor film serve as a donor to release electrons as carriers. As a result, in a transistor including an oxide semiconductor layer having oxygen vacancies, the threshold voltage shifts to the negative direction. When oxygen is sufficiently supplied from the base insulating layer to the oxide semiconductor layer and the oxide semiconductor layer preferably contains excess oxygen, the density of oxygen vacancies in the oxide semiconductor layer, which cause the shift of the threshold voltage to the negative direction, can be reduced.

The excess oxygen contained in the base insulating layer 402 can be supplied to the oxide semiconductor layer 404 in contact with the base insulating layer 402 by a heat treatment in a manufacturing process of the transistor (e.g., heating of the substrate 400 at the time of depositing an oxide semiconductor layer or the deposition temperature at the time of depositing the gate insulating layer). Therefore, an oxygen-excess region is formed in at least part of the interface between the base insulating layer 402 and the oxide semiconductor layer 404 or part of the oxide semiconductor layer 404 (in a bulk) of the transistor 420. Note that a heat treatment step for the purpose of supplying oxygen from the base insulating layer 402 to the oxide semiconductor layer 404 may be added.

Figure 2C:
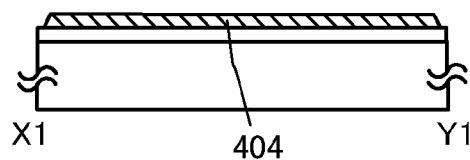

Next, the oxide semiconductor layer is formed over the base insulating layer 402 into which oxygen is introduced and processed into an island shape to form the oxide semiconductor layer 404 (see FIG. 2C).

The oxide semiconductor layer 404 may have either a single-layer structure or a layered structure. Further, the oxide semiconductor layer may either have an amorphous structure or a crystalline structure. In the case where the oxide semiconductor layer 404 has an amorphous structure, a heat treatment may be performed on the oxide semiconductor layer 404 in a later manufacturing process so that the oxide semiconductor layer 404 has crystallinity. The heat treatment for crystallizing the amorphous oxide semiconductor layer is performed at a temperature higher than or equal to 250° C. and lower than or equal to 700° C., preferably higher than or equal to 400° C., more preferably higher than or equal to 500° C., much more preferably higher than or equal to 550° C. Note that the heat treatment can also serve as another heat treatment in the manufacturing process.

The oxide semiconductor layer 404 can be formed by a sputtering method, a molecular beam epitaxy (MBE) method, a CVD method, a pulse laser deposition method, an atomic layer deposition (ALD) method, or the like as appropriate. The oxide semiconductor layer 404 may be formed with a sputtering apparatus which performs deposition in the state where top surfaces of a plurality of substrates are substantially perpendicular to a top surface of a sputtering target.

At the time of forming the oxide semiconductor layer 404, the concentration of hydrogen contained in the oxide semiconductor layer 404 is preferably reduced as much as possible. In order to reduce the hydrogen concentration, for example, in the case where the oxide semiconductor layer 404 is formed by a sputtering method, a rare gas (typically, an argon gas), an oxygen gas, and a mixed gas of a rare gas and an oxygen gas, which are high-purity gases and from which impurities such as hydrogen, water, a hydroxyl group, and hydride are removed, are used as appropriate as an atmosphere gas supplied to a treatment chamber of the sputtering apparatus.

The oxide semiconductor layer 404 is deposited in such a manner that a sputtering gas from which hydrogen and moisture have been removed is introduced into the treatment chamber while moisture remaining therein is removed, whereby the hydrogen concentration in the deposited oxide semiconductor layer can be reduced. In order to remove moisture remaining in the treatment chamber, an entrapment vacuum pump such as a cryopump, an ion pump, or a titanium sublimation pump is preferably used. A turbo molecular pump to which a cold trap is added may be used. In the treatment chamber which is evacuated with a cryopump, for example, a hydrogen atom, a compound containing a hydrogen atom, such as water ($H_2O$), (more preferably, also a compound containing a carbon atom), and the like have high evacuation capability; therefore, the concentration of an impurity contained in the oxide semiconductor layer 404 deposited in the treatment chamber can be reduced.

Further, when the oxide semiconductor layer 404 is formed by a sputtering method, the relative density (fill rate) of a metal oxide target that is used for the deposition is greater than or equal to 90%, preferably greater than or equal to 95%. With the use of a metal oxide target with a high relative density, a dense oxide semiconductor layer can be formed.

In order to reduce the impurity concentration in the oxide semiconductor layer 404, it is also effective to form the oxide semiconductor layer 404 while the substrate 400 is kept at high temperature. The heating temperature of the substrate 400 is higher than or equal to 150° C. and lower than or equal to 450° C., and the substrate temperature is preferably higher than or equal to 200° C. and lower than or equal to 350° C. A crystalline oxide semiconductor layer can be formed by heating the substrate at a high temperature at the time of the film formation.

An oxide semiconductor to be used for the oxide semiconductor layer 404 preferably contains at least indium (In) or zinc (Zn). In particular, both In and Zn are preferably contained. It is preferable that gallium (Ga) be additionally contained as a stabilizer for reducing a variation in electric characteristics of the transistor including the oxide semiconductor layer. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by a chemical formula $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula $In_2SnO_5(ZnO)_n$ (n>0, n is an integer) may be used.

For example, an In—Ga—Zn-based oxide with an atomic ratio of In:Ga:Zn being 1:1:1 (=1/3:1/3:1/3), 2:2:1 (=2/5:2/5:1/5), or 3:1:2 (=1/2:1/6:1/3), or any of oxides whose composition is in the neighborhood of the above compositions can be used. Alternatively, an In—Sn—Zn-based oxide with an atomic ratio of In:Sn:Zn is 1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, without limitation to the materials given above, a material having an appropriate composition can be used in accordance with semiconductor characteristics which are necessary (such as mobility, threshold value, and variation). In order to obtain semiconductor characteristics which are necessary, it is preferable that the carrier density, the impurity concentration, the defect density, the atomic ratio of a metal element to oxygen, the interatomic distance, the density, and the like be set as appropriate.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

It is preferable that a high-purity gas from which an impurity such as hydrogen, water, a hydroxyl group, or hydride is removed be used as a sputtering gas at the time of forming the oxide semiconductor layer 404.

The oxide semiconductor layer 404 is preferably a c-axis aligned crystalline oxide semiconductor (CAAC-OS) film.

The CAAC-OS film is not completely single crystal nor completely amorphous. The CAAC-OS film is an oxide semiconductor layer with a crystal-amorphous mixed phase structure where a crystal portion and an amorphous portion are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility, which is due to the grain boundary, is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is in some cases higher than that in the vicinity of the surface where the oxide semiconductor film is formed. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing a treatment for crystallization such as a heat treatment after film formation.

With the use of the CAAC-OS film in a transistor, change in electric characteristics of the transistor due to irradiation with visible light or ultraviolet light is small. Thus, the transistor has high reliability.

There are three methods for obtaining a CAAC-OS film when the CAAC-OS film is used for the oxide semiconductor layer 404. The first method is to deposit an oxide semiconductor layer at a deposition temperature higher than or equal to 200° C. and lower than or equal to 450° C., thereby obtaining c-axis alignment substantially perpendicular to the surface of the oxide semiconductor layer 404. The second method is to deposit a thin oxide semiconductor layer and then subject the layer to a heat treatment performed at a temperature higher than or equal to 200° C. and lower than or equal to 700° C., thereby obtaining c-axis alignment substantially perpendicular to the surface thereof. The third method is to deposit a first thin oxide semiconductor layer, subject the layer to a heat treatment performed at a temperature higher than or equal to 200° C. and lower than or equal to 700° C., and then deposit a second oxide semiconductor layer, thereby obtaining c-axis alignment substantially perpendicular to the surface thereof.

For example, the CAAC-OS film is formed by a sputtering method with a polycrystalline oxide semiconductor sputtering target. When ions collide with the sputtering target, a crystal region included in the sputtering target may be cleaved along an a-b plane, and a sputtered particle having a plane parallel to an a-b plane (flat-plate-like sputtered particle or pellet-like sputtered particle) may separate from the sputtering target. In that case, the flat-plate-like sputtered particle reaches a substrate while maintaining their crystal state, whereby the CAAC-OS film can be formed.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, when the flat-plate-like sputtered particle reaches the substrate, migration occurs on the substrate surface, so that a flat plane of the flat-plate-like sputtered particle is attached to the substrate. Specifically, the substrate heating temperature during the deposition is higher than or equal to 100° C. and lower than or equal to 740° C., preferably higher than or equal to 200° C. and lower than or equal to 500° C.

Further, it is preferable that the proportion of oxygen in the deposition gas be increased and the power be optimized in order to reduce plasma damage at the deposition. The proportion of oxygen in the deposition gas is higher than or equal to 30 vol. %, preferably lower than or equal to 100 vol. %.

As an example of the sputtering target, an In—Ga—Zn—O compound target will be described below.

The In—Ga—Zn—O compound target which is polycrystalline is made by mixing $InO_x$ powder, $GaO_y$ powder, and $ZnO_z$ powder in a predetermined molar ratio, applying pressure, and performing a heat treatment at a temperature higher than or equal to 1000° C. and lower than or equal to 1500° C. Note that x, y, and z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Before the formation of the oxide semiconductor layer 404, a planarization treatment may be performed on the surface on which the oxide semiconductor layer 404 is to be formed. As the planarization treatment, a polishing treatment (e.g., a chemical mechanical polishing (CMP) method), a dry etching treatment, or a plasma treatment can be used, though there is no particular limitation on the planarization treatment.

As a plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface on which the oxide semiconductor layer 404 is formed.

As the planarization treatment, a polishing treatment, a dry etching treatment, or a plasma treatment may be performed plural times, or these treatments may be performed in combination. In the case where the treatments are combined, the order of steps is not particularly limited and may be set as appropriate depending on the roughness of the surface of the oxide semiconductor layer 404.

Next, the gate insulating layer 406 is formed over the oxide semiconductor layer 404. The gate insulating layer 406 has a thickness larger than or equal to 1 nm and smaller than or equal to 20 nm and can be formed by a sputtering method, a MBE method, a CVD method, a pulse laser deposition method, an ALD method, or the like as appropriate. Alternatively, the gate insulating layer 406 may be formed with a sputtering apparatus where deposition is performed with surfaces of a plurality of substrates set to be substantially perpendicular to a surface of a sputtering target.

Note that in the case where the gate insulating layer 406 is formed by a CVD method, a dehydration or dehydrogenation treatment and a subsequent oxygen doping treatment may be performed on the gate insulating layer 406 after its formation.

The gate insulating layer 406 can be formed using silicon oxide, gallium oxide, aluminum oxide, silicon nitride, silicon oxynitride, aluminum oxynitride, silicon nitride oxide, or the like. It is preferable that the gate insulating layer 406 include oxygen in a portion which is in contact with the oxide semiconductor layer 404.

The gate insulating layer 406 can be formed using a high-k material such as hafnium oxide, yttrium oxide, hafnium silicate, hafnium silicate to which nitrogen is added, hafnium aluminate, or lanthanum oxide, whereby gate leakage current can be reduced. Further, the gate insulating layer 406 may have either a single-layer structure or a layered structure.

Note that after the gate insulating layer 406 is formed, a deposition temperature of a layer which will be formed over the gate insulating layer 406 (e.g., the gate electrode layer 408, the interlayer insulating layer 410, or the interlayer insulating layer 412) is preferably set to be lower than or equal to the deposition temperature of the gate insulating layer 406. Similarly, in the case where a heat treatment is performed after the gate insulating layer 406 is formed in a manufacturing process of the transistor, a heating temperature of the heat treatment is preferably set to be lower than or equal to the deposition temperature of the gate insulating layer 406. When such a deposition temperature or a heating temperature is set to be lower than or equal to the deposition temperature of the gate insulating layer 406, elimination of oxygen from the oxide semiconductor layer 404 can be suppressed.

Figure 2D:
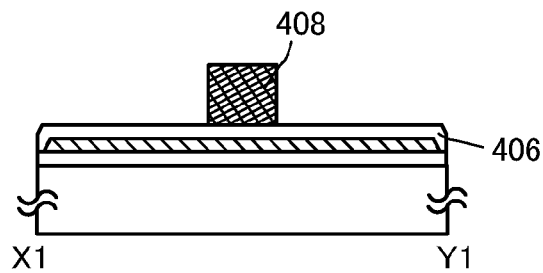

Next, the gate electrode layer 408 which overlaps with the oxide semiconductor layer 404 with the gate insulating layer 406 provided therebetween is formed (see FIG. 2D).

The gate electrode layer 408 can be formed by a plasma-enhanced CVD method, a sputtering method, or the like. The gate electrode layer 408 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like can be used. Alternatively, a semiconductor film typified by a polycrystalline silicon film doped with an impurity element such as phosphorus, or a silicide film such as a nickel silicide film may be used as the gate electrode layer 408. The gate electrode layer 408 may have a single-layer structure or a layered structure.

The gate electrode layer 408 can also be formed using a conductive material such as indium oxide tin oxide, indium oxide containing tungsten oxide, indium zinc oxide containing tungsten oxide, indium oxide containing titanium oxide, indium tin oxide containing titanium oxide, indium oxide zinc oxide, or indium tin oxide to which silicon oxide is added. It is also possible that the gate electrode layer 408 has a layered structure of the above conductive material and the above metal material.

As one of the layers of the gate electrode layer 408, which is in contact with the gate insulating layer 406, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. Such a film has a work function higher than or equal to 5 eV, preferably higher than or equal to 5.5 eV, and the use of this film as the gate electrode layer enables the threshold voltage of the transistor to be shifted to the positive direction. Accordingly, a normally-off switching element can be obtained.

After that, the interlayer insulating layer 410 and the interlayer insulating layer 412 are formed over the gate insulating layer 406 and the gate electrode layer 408. Note that although, in this embodiment, the interlayer insulating layer 410 and the interlayer insulating layer 412 are stacked over the gate insulating layer 406 and the gate electrode layer 408, an insulating layer having a single-layer structure may be provided thereover without limitation of one embodiment of the present invention thereto. Alternatively, three or more insulating layers may be stacked.

The interlayer insulating layer 410 or the interlayer insulating layer 412 can be formed by a plasma-enhanced CVD method, a sputtering method, an evaporation method, or the like. The interlayer insulating layer 410 or the interlayer insulating layer 412 can be typically formed using an inorganic insulating film such as a silicon oxide film, a silicon oxynitride film, an aluminum oxynitride film, or a gallium oxide film.

Alternatively, the interlayer insulating layer 410 or the interlayer insulating layer 412 can be formed using an aluminum oxide film, a hafnium oxide film, a magnesium oxide film, a zirconium oxide film, a lanthanum oxide film, a barium oxide film, or a metal nitride film (e.g., an aluminum nitride film).

Note that an aluminum oxide film is preferably provided as the interlayer insulating layer 410 or the interlayer insulating layer 412. The aluminum oxide film can be preferably used because it has a high shielding effect (blocking effect) which prevents permeance of both oxygen and impurities such as hydrogen and moisture, and, in and after the manufacturing process, the aluminum oxide film functions as a protective film for preventing entry of an impurity such as hydrogen or moisture, which causes a change in characteristics, into the oxide semiconductor layer 404 and release of oxygen, which is a main constituent material of the oxide semiconductor, from the oxide semiconductor layer 404. Thus, when the oxide semiconductor layer 404 and/or the base insulating layer 402 in contact therewith include(s) an oxygen-excess region, at least one oxygen-excess region can be provided in the film (bulk) of the oxide semiconductor layer 404 or the interface between the base insulating layer 402 and the oxide semiconductor layer 404 by performing a heat treatment in a state where the aluminum oxide film is provided.

In this embodiment, an aluminum oxide film is formed as the interlayer insulating layer 410 and a silicon oxide film is formed as the interlayer insulating layer 412. Providing an aluminum oxide film having high density (film density: 3.2 $g/cm^3$ or higher, preferably 3.6 $g/cm^3$ or higher) can stabilize the electric characteristics of the transistor 420. The film density can be measured by Rutherford backscattering spectrometry (RBS) or X-ray reflection (XRR).

Figure 2E:
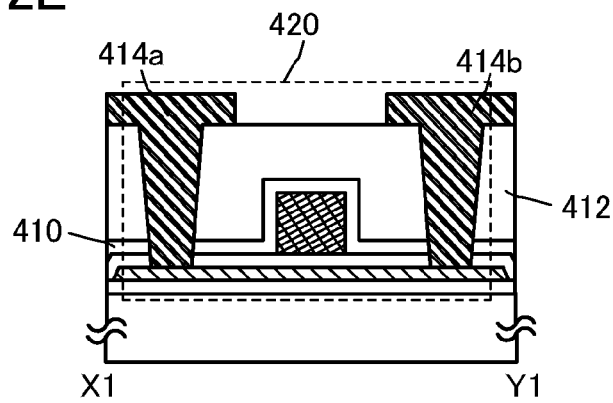

Next, openings that reach the oxide semiconductor layer 404 are formed in the interlayer insulating layer 412, the interlayer insulating layer 410, and the gate insulating layer 406, and the source electrode layer 414a and the drain electrode layer 414b are formed over the interlayer insulating layer 412 so as to fill the openings (see FIG. 2E).

The source electrode layer 414a and the drain electrode layer 414b can be formed using a material and a method which are similar to those of the gate electrode layer 408; for example, a metal film containing an element selected from Al, Cr, Cu, Ta, Ti, Mo, and W or a metal nitride film containing any of these elements as its component (e.g., a titanium nitride film, a molybdenum nitride film, or a tungsten nitride film) can be used. A metal film having a high melting point such as Ti, Mo, or W or a metal nitride film of any of these elements (e.g., a titanium nitride film, a molybdenum nitride film, or a tungsten nitride film) may be stacked on one of or both of a lower side and an upper side of a metal film of Al or Cu. Alternatively, the source electrode layer 414a and the drain electrode layer 414b may be formed using a conductive metal oxide. As the conductive metal oxide, indium oxide ($In_2O_3$), tin oxide ($SnO_2$), zinc oxide (ZnO), indium oxide-tin oxide (ITO), indium oxide-zinc oxide ($In_2O_3$—ZnO), or any of these metal oxide materials in which silicon oxide is contained can be used.

Through the above-described process, the transistor 420 of this embodiment can be formed.

Although not illustrated, a planarization insulating layer for planarization may be provided over the transistor 420. The planarization insulating layer can be formed using a heat-resistant organic material, such as polyimide, acrylic, polyimide amide, benzocyclobutene, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the planarization insulating layer may be formed by stacking a plurality of insulating layers formed using these materials.

Alternatively, after the transistor 420 is formed, a heat treatment may be performed in the air at a temperature higher than or equal to 100° C. and lower than or equal to the deposition temperature of the gate insulating layer 406, for example, higher than or equal to 100° C. and lower than or equal to 400° C. This heat treatment may be performed at a fixed heating temperature; alternatively, the following change in the heating temperature may be conducted plural times: the heating temperature is increased from room temperature to a temperature higher than or equal to 100° C. and lower than or equal to the deposition temperature of the gate insulating layer 406 and then decreased to room temperature. Further, this heat treatment may be performed under a reduced pressure. The heat treatment time can be shortened under the reduced pressure. This heat treatment can supply oxygen contained in the base insulating layer 402 to the oxide semiconductor layer 404, which enables improvement in the reliability of the semiconductor device.

In the semiconductor device described in this embodiment, the dehydration or dehydrogenation treatment is performed on the base insulating layer 402 provided in contact with the oxide semiconductor layer 404, and the oxygen doping treatment is subsequently performed on the base insulating layer 402 subjected to the dehydration or dehydrogenation treatment. By formation of the oxide semiconductor layer 404 in contact with the base insulating layer 402 whose water and hydrogen contents are decreased and whose oxygen content is increased, oxygen can be supplied to the oxide semiconductor layer 404 while entry of the water and hydrogen into the oxide semiconductor layer 404 is suppressed.

Thus, an oxygen-excess region can be formed in the oxide semiconductor layer 404 and/or at the interface between the oxide semiconductor layer 404 and the base insulating layer 402. Accordingly, since the density of oxygen vacancies in the oxide semiconductor layer, which cause the shift of the threshold voltage to the negative direction, can be reduced, variation in the threshold voltage of the transistor 420 can be reduced and a normally-off transistor can be achieved. Further, the subthreshold value (S value) of the transistor 420 can be reduced.

In addition, in the semiconductor device described in this embodiment, since the oxygen doping treatment is performed on the base insulating layer 402 in contact with the oxide semiconductor layer 404 provided thereon, the oxide semiconductor layer 404 can have higher film quality and/or crystallinity than the oxide semiconductor layer 404 which is directly subjected to an oxygen doping treatment. Particularly in the case where the oxide semiconductor layer 404 is a CAAC-OS film, which is subjected to an oxygen doping treatment, crystallinity of the CAAC-OS film deteriorates in some cases; therefore, it is effective to apply the method for manufacturing a semiconductor device, which is described in this embodiment.

The methods and structures described in this embodiment can be combined as appropriate with any of the methods and structures described in the other embodiments.

Embodiment 2

In this embodiment, a structure and a manufacturing method of a semiconductor device according to one embodiment of the disclosed invention, which are different from those of Embodiment 1, will be described with reference to FIGS. 3A to 3C, FIGS. 4A to 4E, FIGS. 5A to 5C, and FIGS. 6A to 6C. Note that the same portion as or a portion having a function similar to those in the above embodiment can be formed in a manner similar to that described in the above embodiment, and also the steps similar to those in the above embodiment can be performed in a manner similar to that described in the above embodiment, and description thereof is not repeated. In addition, detailed description of the same portions is not repeated.

Figure 3A:
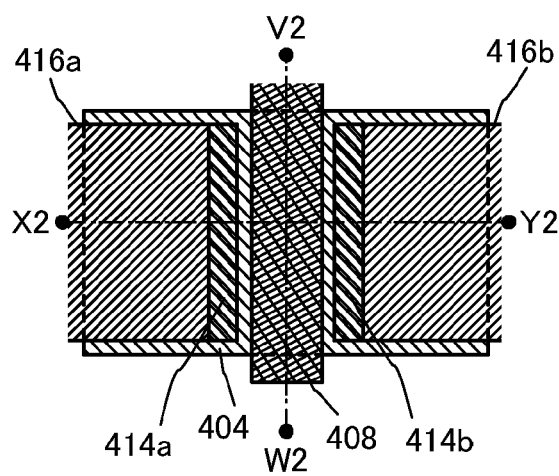
FIGS. 3A to 3C are a plan view and cross-sectional views of a semiconductor device according to one embodiment of the present invention.
Figure 3C:
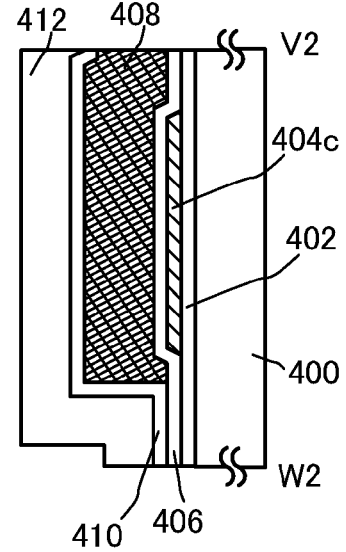
Figure 3B:
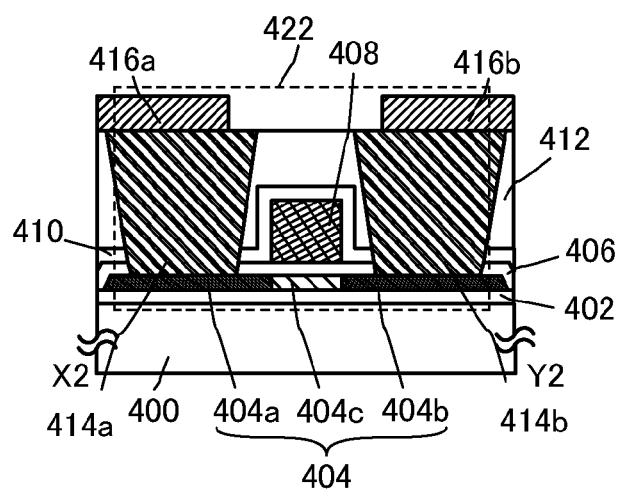

FIGS. 3A to 3C illustrate a structural example of a transistor 422. FIG. 3A is a plan view of the transistor 422, FIG. 3B is a cross-sectional view taken along the line X2-Y2 in FIG. 3A, and FIG. 3C is a cross-sectional view taken along the line V2-W2 in FIG. 3A. Note that in FIG. 3A, some components of the transistor 422 (e.g., the interlayer insulating layer 412) are not illustrated for clarity.

The transistor 422 illustrated in FIGS. 3A to 3C includes the base insulating layer 402 provided over the substrate 400, an oxide semiconductor layer 404 which is provided over the base insulating layer 402 and includes a pair of low-resistance regions 404a and 404b and a channel formation region 404c, the gate insulating layer 406 provided over the oxide semiconductor layer 404, the gate electrode layer 408 which overlaps with the channel formation region 404c with the gate insulating layer 406 provided therebetween, the source electrode layer 414a and the drain electrode layer 414b electrically connected to the oxide semiconductor layer 404, and a wiring layer 416a electrically connected to the source electrode layer 414a and a wiring layer 416b electrically connected to the drain electrode layer 414b. In addition, the transistor 422 may further include, as its components, the interlayer insulating layer 410 and the interlayer insulating layer 412 which are provided over the gate electrode layer 408.

An example of a method for manufacturing the transistor 422 of this embodiment will be described below with reference to FIGS. 4A to 4E, FIGS. 5A to 5C, and FIGS. 6A to 6C.

Figure 4A:
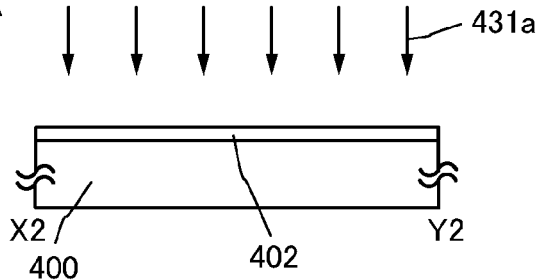
FIGS. 4A to 4E are cross-sectional views illustrating a method for manufacturing a semiconductor device according to one embodiment of the present invention.

First, the base insulating layer 402 is formed over the substrate 400 having an insulating surface, and then a treatment for introducing oxygen 431a is performed on the base insulating layer 402 (see FIG. 4A). At least any of an oxygen radical, ozone, an oxygen atom, and an oxygen ion (including a molecular ion and a cluster ion) is included in the oxygen 431a. By introduction of oxygen 431a into the base insulating layer 402 before a dehydration or dehydrogenation treatment, a bond between hydrogen and an element included in the base insulating layer 402 (e.g., silicon) or a bond between a hydroxyl group and the element are cleaved, the hydrogen or hydroxyl group reacts with oxygen, and then water is generated. Accordingly, hydrogen or a hydroxyl group contained in the base insulating layer 402 can be eliminated easily as water by the dehydration or dehydrogenation treatment which will be performed on the base insulating layer 402 after introduction of the oxygen 431a. Further, in the dehydration or dehydrogenation treatment, the temperature can be lowered or the processing time can be shortened.

The conditions in the introduction step of the oxygen 431 in Embodiment 1 can be referred to for those of the oxygen 431a.

Note that atoms (or ions) to be introduced into the base insulating layer 402 are not necessarily those of oxygen because the purpose of the oxygen doping treatment is to cleave a bond between hydrogen (or a hydroxyl group) and an element included in the base insulating layer 402. For example, instead of the oxygen 431a, a rare gas such as argon may be introduced.

Next, a heat treatment for the purpose of the dehydration or dehydrogenation treatment is performed on the base insulating layer 402 into which the oxygen 431a is introduced. The temperature of the heat treatment is higher than or equal to 250° C. and lower than or equal to the strain point of the substrate.

Figure 4B:
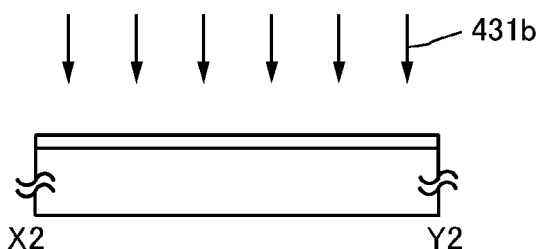

Next, oxygen 431b is introduced into the base insulating layer 402 subjected to the dehydration or dehydrogenation treatment to compensate oxygen which has eliminated from the base insulating layer 402 by the dehydration or dehydrogenation treatment (see FIG. 4B). In detail, the introduction step of the oxygen 431b can be performed in a manner similar to that of the oxygen 431 in Embodiment 1.

Note that the dehydration or dehydrogenation treatment and/or the oxygen doping treatment may be performed plural times on the base insulating layer 402.

Figure 4C:
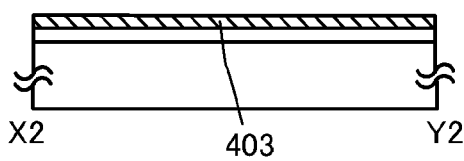

Next, an oxide semiconductor layer 403 is formed over the base insulating layer 402 in a manner similar to that of Embodiment 1 (see FIG. 4C).

Further, after the oxide semiconductor layer 403 is formed, the oxide semiconductor layer 403 is preferably subjected to a heat treatment for removing (dehydrating or dehydrogenating) excess hydrogen (including water and a hydroxyl group) contained therein. The temperature of the heat treatment is higher than or equal to 300° C. and lower than or equal to 700° C., or lower than the strain point of the substrate. The heat treatment can be performed under reduced pressure, a nitrogen atmosphere, or the like.

Hydrogen, which is an impurity imparting n-type conductivity, can be removed from the oxide semiconductor by this heat treatment. For example, the hydrogen concentration in the oxide semiconductor layer 403 after the dehydration or dehydrogenation treatment can be lower than or equal to $5 \times 10^{19}/cm^3$, preferably lower than or equal to $5 \times 10^{18}/cm^3$. By this heat treatment, oxygen contained in the base insulating layer 402 can be supplied to the oxide semiconductor layer 403. Oxygen vacancies of the oxide semiconductor layer 403, which are caused due to elimination of oxygen by the dehydration or dehydrogenation treatment performed on the oxide semiconductor layer 403, which occurs at the same time, can be compensated by supply of oxygen from the base insulating layer 402.

Note that the heat treatment for the dehydration or dehydrogenation, which is performed on the oxide semiconductor layer 403, is preferably performed before the oxide semiconductor layer 403 is processed into the oxide semiconductor layer 404 having an island shape, in which case release of oxygen contained in the base insulating layer 402 by the heat treatment can be prevented.

The heat treatment for dehydration or dehydrogenation may serve as another heat treatment of a manufacturing process of the transistor 422.

Note that in the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably set to be higher than or equal to 6N (99.9999%), more preferably higher than or equal to 7N (99.99999%) (i.e., the concentration of impurities is lower than or equal to 1 ppm, preferably lower than or equal to 0.1 ppm).

In addition, after the oxide semiconductor layer 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably higher than or equal to 6N, more preferably higher than or equal to 7N (i.e., the impurity concentration in the oxygen gas or the dinitrogen monoxide gas is preferably lower than or equal to 1 ppm, more preferably lower than or equal to 0.1 ppm). The oxygen gas or the dinitrogen monoxide gas acts to supply oxygen that is a main component of the oxide semiconductor and that is reduced by the step for removing an impurity by the dehydration or dehydrogenation treatment, so that the oxide semiconductor layer 403 can be a high-purified and i-type (intrinsic) oxide semiconductor layer.

Figure 4D:
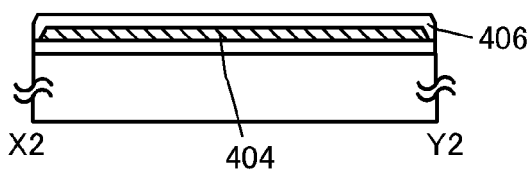
Figure 4E:
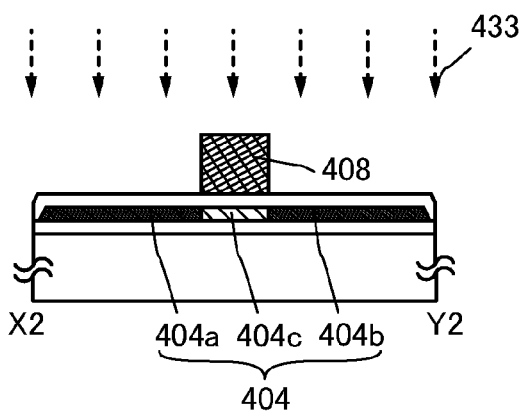

Next, after the oxide semiconductor layer 403 is processed into the oxide semiconductor layer 404 having an island shape, the gate insulating layer 406 is formed over the oxide semiconductor layer 404 (see FIG. 4D).

Note that the gate electrode layer 408 can be formed by processing a conductive film (not illustrated) provided over the gate insulating layer 406 with the use of a mask. Here, as the mask used for processing, it is preferable to use a mask having a finer pattern which is formed by performing a slimming process on a mask formed by a photolithography method or the like.

As the slimming process, an ashing process in which oxygen in a radical state (an oxygen radical) is used can be employed, for example. However, the slimming process is not limited to the ashing process as long as the mask formed by a photolithography method or the like can be processed into a finer pattern. Note that the channel length (L) of a transistor is determined by the mask formed by the slimming process; therefore, a process with high controllability can be employed as the slimming process.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can be greater than or equal to 30 nm and less than or equal to 2000 nm, preferably greater than or equal to 50 nm and less than or equal to 350 nm. This enables further miniaturization of the transistor.

Next, the pair of low-resistance regions 404a and 404b is formed by introduction of a dopant 433 into the oxide semiconductor layer 404, using the gate electrode layer 408 as a mask. Thus, the oxide semiconductor layer 404 in which the pair of low-resistance regions is formed with the channel formation region 404c provided therebetween is formed by the introduction of the dopant 433 (see FIG. 4E)

The dopant 433 can be introduced by an ion implantation method, an ion doping method, a plasma immersion ion implantation method, or the like. In the case where the above method is used, it is preferable to use a single ion, a fluoride ion, or a chloride ion of the dopant 433.

The introduction of the dopant 433 may be controlled by setting the implantation conditions such as the acceleration voltage and the dosage, or the thickness of the films through which the dopant passes, as appropriate. The dosage of the dopant 433 is set to be greater than or equal to $1\times10^{13}$ ions/cm$^2$ and less than or equal to $5\times10^{16}$ ions/cm$^2$, for example. The concentration of the dopant 433 in the pair of low-resistance regions is preferably greater than or equal to $5\times10^{18}$/cm$^3$ and less than or equal to $1\times10^{22}$/cm$^3$.

The dopant 433 may be introduced while the substrate 400 is heated.

The dopant 433 may be introduced into the oxide semiconductor layer 404 plural times, and a plurality of kinds of dopant may be used.

Further, a heat treatment may be performed thereon after the introduction of the dopant 433. The heat treatment is preferably performed at a temperature(s) higher than or equal to 300° C. and lower than or equal to the deposition temperature of the gate insulating layer 406, more preferably higher than or equal to 300° C. and lower than or equal to 450° C., under an oxygen atmosphere for an hour. The heat treatment may be performed under a nitrogen atmosphere, reduced pressure, or the air (ultra-dry air).

In the case where the oxide semiconductor layer 404 is a CAAC-OS film, part of the oxide semiconductor layer 404 may become amorphous by the introduction of the dopant 433. In this case, the crystallinity of the oxide semiconductor layer 404 can be recovered by performing the heat treatment thereon after the introduction of the dopant 433.

Figure 5A:
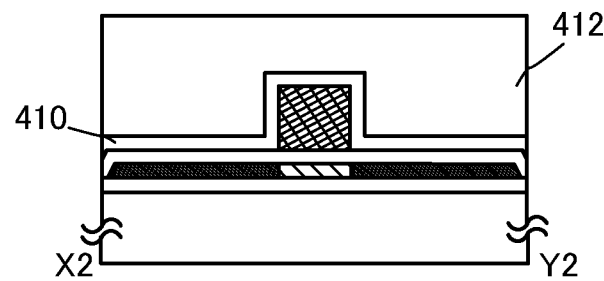
FIGS. 5A to 5C are cross-sectional views illustrating a method for manufacturing a semiconductor device according to one embodiment of the present invention.

After that, the interlayer insulating layer 410 and the interlayer insulating layer 412 are formed over the gate insulating layer 406 and the gate electrode layer 408 (see FIG. 5A).

Figure 5B:
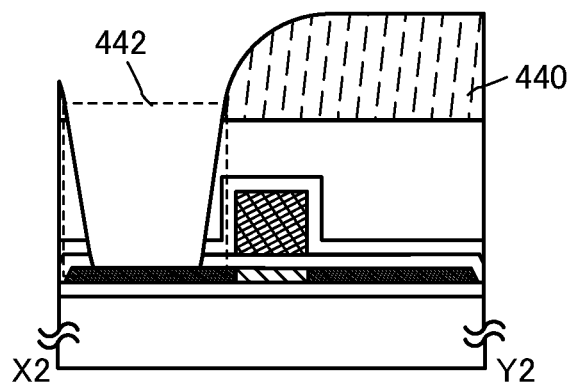
Figure 5C:
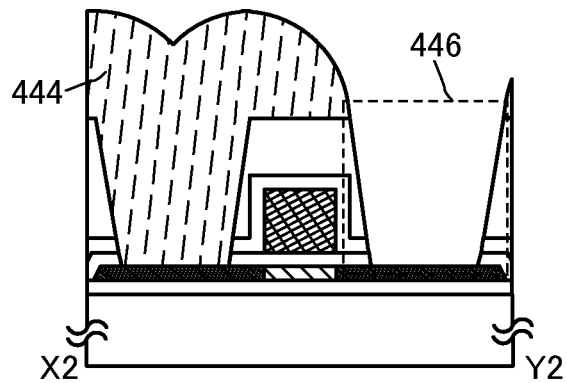

Next, a mask 440 is formed over the interlayer insulating layer 412; and the interlayer insulating layer 412, the interlayer insulating layer 410, and the gate insulating layer 406 are etched with the use of the mask 440, so that an opening 442 which reaches the oxide semiconductor layer 404 (specifically, the low-resistance region 404a) is formed (see FIG. 5B).

The mask 440 can be formed by a photolithography method or the like using a material such as a photoresist. For light exposure at the time of forming the mask 440, extreme ultraviolet light having a wavelength as short as several nanometers to several tens of nanometers is preferably used.

In the light exposure by extreme ultraviolet light, the resolution is high and the focus depth is large. Thus, the mask 440 having a fine pattern can be formed.

As long as the mask 440 having a sufficiently fine pattern can be formed, a different method such as an ink-jet method may be used to form the mask 440. In this case, it is unnecessary to use a photosensitive material such as a photoresist as a material of the mask 440.

After the mask 440 is removed, a mask 444 is formed in the opening 442 and over the interlayer insulating layer 412. The mask 444 can be formed in a manner similar to that of the mask 440. The interlayer insulating layer 412, the interlayer insulating layer 410, and the gate insulating layer 406 are etched with the use of the mask 444, so that an opening 446 which reaches the oxide semiconductor layer 404 (specifically, the low-resistance region 404b) is formed (see FIG. 5C). Thus, the openings between which the gate electrode layer 408 is provided is formed in the gate insulating layer 406, the interlayer insulating layer 410, and the interlayer insulating layer 412.

Figure 6A:
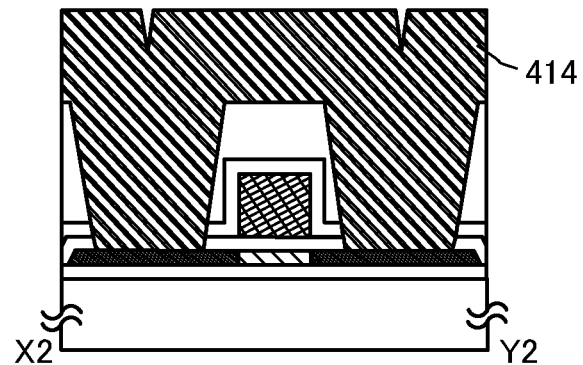
FIGS. 6A to 6C are cross-sectional views illustrating a method for manufacturing a semiconductor device according to one embodiment of the present invention.

Next, a conductive film 414 to be the source electrode layer and the drain electrode layer is formed over the interlayer insulating layer 412 to be embedded in the opening 442 and the opening 446 (see FIG. 6A).

The conductive film 414 is formed using a material that can withstand a heat treatment performed later. For example, a metal film containing an element selected from Al, Cr, Cu, Ta, Ti, Mo, and W or a metal nitride film containing any of the above elements as a component (e.g., a titanium nitride film, a molybdenum nitride film, or a tungsten nitride film) can be used. A metal film having a high melting point such as Ti, Mo, or W or a metal nitride film of any of these elements (e.g., a titanium nitride film, a molybdenum nitride film, or a tungsten nitride film) may be stacked on one of or both of a lower side and an upper side of a metal film of Al or Cu. Further alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), ITO, indium oxide-zinc oxide ($In_2O_3$—ZnO), or any of these metal oxide materials in which silicon oxide is contained can be used.

Figure 6B:
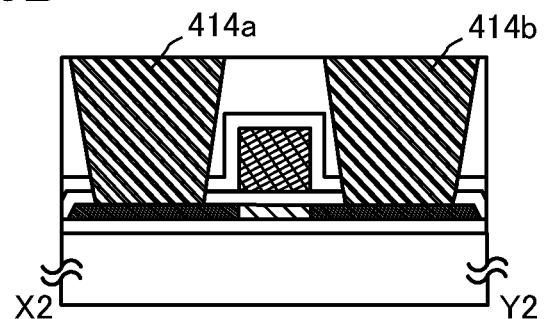

Next, a CMP treatment is performed on the conductive film 414 (see FIG. 6B). The CMP treatment is performed on the conductive film 414 in order to remove the conductive film 414 provided over the interlayer insulating layer 412 (at least a region which is overlapped with the gate electrode layer 408), whereby the source electrode layer 414a and the drain electrode layer 414b embedded in the opening 442 and the opening 446, respectively, can be formed. In this embodiment, through the CMP treatment performed on the conductive film 414 under such conditions that the surface of the interlayer insulating layer 412 can be exposed, the source electrode layer 414a and the drain electrode layer 414b are formed. Note that the surface of the interlayer insulating layer 412, the surface of the interlayer insulating layer 410, or the surface of the gate electrode layer 408 may also be polished depending on the conditions of the CMP treatment.

The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, it is preferable that first polishing be performed at a high polishing rate and final polishing be performed at a low polishing rate. By performing polishing at different polishing rates in combination, the surfaces of the source electrode layer 414a, the drain electrode layer 414b, and the interlayer insulating layer 412 can be further improved.

Note that in this embodiment, the CMP treatment is used for removing the conductive film 414 in the region which is overlapped with the interlayer insulating layer 412; however, another polishing (grinding or cutting) treatment may be used. Alternatively, the polishing treatment such as the CMP treatment may be combined with an etching (dry etching or wet etching) treatment, a plasma treatment, or the like. For example, after the CMP treatment, a dry etching treatment or a plasma treatment (reverse sputtering or the like) may be performed to improve the planarity of the surface to be processed. In the case where the polishing treatment is combined with an etching treatment, a plasma treatment or the like, the order of the steps is not particularly limited, and may be set as appropriate depending on the material, thickness, and roughness of the surface of the conductive film 414.

As described above, the source electrode layer 414a or the drain electrode layer 414b is provided to be embedded in the opening provided in the gate insulating layer 406, the interlayer insulating layer 410, and the interlayer insulating layer 412. Therefore, in the transistor 422, a distance between the gate electrode layer 408 and a region where the source electrode layer 414a is in contact with the oxide semiconductor layer 404 (a source side contact region) is determined by a width between an end portion of the opening 442 and an end portion of the gate electrode layer 408. In the same manner, in the transistor 422, a distance between the gate electrode layer 408 and a region where the drain electrode layer 414b is in contact with the oxide semiconductor layer 404 (a drain side contact region) is determined by a width between an end portion of the opening 446 and an end portion of the gate electrode layer 408.

In the case where the opening 442 for providing the source electrode layer 414a and the opening 446 for providing the drain electrode layer 414b are formed by performing an etching treatment once, the minimum feature size of a width between the opening 442 and the opening 446 in the channel length direction is limited to a resolution limit of a light-exposure apparatus used for forming a mask. Therefore, it is difficult to reduce a distance between the opening 442 and the opening 446 sufficiently, so that it is also difficult to reduce distances between the source side contact region and the gate electrode layer 408, and between the drain side contact region and the gate electrode layer 408.

However, in the manufacturing method described in this embodiment, the opening 442 and the opening 446 are formed separately by different etching treatments using different masks; therefore, the position of the openings can be set freely without depending on the resolution limit of a light-exposure apparatus. Thus, the distance between the source side contact region or the drain side contact region and the gate electrode layer 408 can be reduced to greater than or equal to 0.05 μm and less than or equal to 0.1 μm, for example. By reducing the distances between the source side contact region and the gate electrode layer 408, and between the drain side contact region and the gate electrode layer 408, the resistance between the source and the drain of the transistor 422 can be reduced, so that the electric characteristics of the transistor (e.g., on-state current characteristics) can be improved.

Further, in the step of removing the conductive film 405 over the interlayer insulating layer 412 for forming the source electrode layer 414a and the drain electrode layer 414b, an etching treatment using a resist mask is not performed, so that the conductive film 405 can be processed minutely and precisely even in the case where the width between the source electrode layer 414a and the drain electrode layer 414b in the channel length direction is narrowed. Thus, in the manufacturing process of the semiconductor device, the transistor 420 having little variation in shapes and characteristics and a minute structure can be fabricated with a high yield.

Figure 6C:
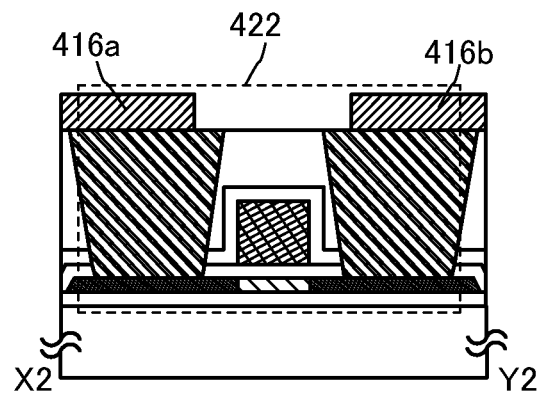

Next, a conductive film to be a source wiring layer or a drain wiring layer (including a wiring formed in the same layer as the wiring layers) is formed over the source electrode layer 414a, the drain electrode layer 414b, and the interlayer insulating layer 412 and is processed, so that the source wiring layer 416a and the drain wiring layer 416b are formed (see FIG. 6C).

The wiring layer 416a and the wiring layer 416b can be formed using a material and a method similar to those of the gate electrode layer 408.

As described above, the width between the source electrode layer 414a and the drain electrode layer 414b in the channel length direction can be processed minutely without depending on the resolution limit of a light-exposure apparatus. On the other hand, the wiring layer 416a and the wiring layer 416b are processed using a mask formed by a photolithography method; therefore, the width between the wiring layer 416a and the wiring layer 416b becomes longer than that between the source electrode layer 414a and the drain electrode layer 414b. For miniaturizing the transistor 420, the width between the wiring layer 416a and the wiring layer 416b is preferably set in accordance with the resolution limit of a light-exposure apparatus.

Through the above-described process, the transistor 422 of this embodiment can be formed.

In the semiconductor device described in this embodiment, a first oxygen doping treatment is performed so as to cleave a bond between an element included in the base insulating layer 402 and hydrogen (or a hydroxyl group), and a dehydration or dehydrogenation treatment is subsequently performed on the base insulating layer 402, which enables the processing temperature to be lowered or the processing time to be shortened. Further, the base insulating layer 402 whose water and hydrogen contents are decreased and whose oxygen content is increased can be obtained by a second oxygen doping treatment performed on the base insulating layer 402 subjected to the dehydration or dehydrogenation treatment. By formation of the oxide semiconductor layer 404 in contact with the base insulating layer 402, oxygen can be supplied to the oxide semiconductor layer 404 while entry of the water and hydrogen into the oxide semiconductor layer 404 is suppressed.

Thus, an oxygen-excess region can be formed in the oxide semiconductor layer 404 and/or at the interface between the oxide semiconductor layer 404 and the base insulating layer 402. Accordingly, since the density of oxygen vacancies in the oxide semiconductor layer, which cause the shift of the threshold voltage to the negative direction, can be reduced, variation in the threshold voltage of the transistor 422 can be reduced and a normally-off transistor can be achieved. Further, the subthreshold value (S value) of the transistor 422 can be reduced.

In addition, in the semiconductor device described in this embodiment, since the oxygen doping treatment is performed on the base insulating layer 402 in contact with the oxide semiconductor layer 404 provided thereon, the oxide semiconductor layer 404 can have higher film quality and/or crystallinity than the oxide semiconductor layer 404 which is directly subjected to an oxygen doping treatment. Particularly in the case where the oxide semiconductor layer 404 is a CAAC-OS film, which is subjected to an oxygen doping treatment, crystallinity of the CAAC-OS film deteriorates in some cases; therefore, it is effective to apply the method for manufacturing a semiconductor device, which is described in this embodiment.

The methods and structures described in this embodiment can be combined as appropriate with any of the methods and structures described in the other embodiments.

Embodiment 3

In this embodiment, an example of a semiconductor device including the transistor described in this specification, which can hold stored data even when not powered and which does not have a limitation on the number of write cycles, will be described with reference to drawings.

Figure 7A:
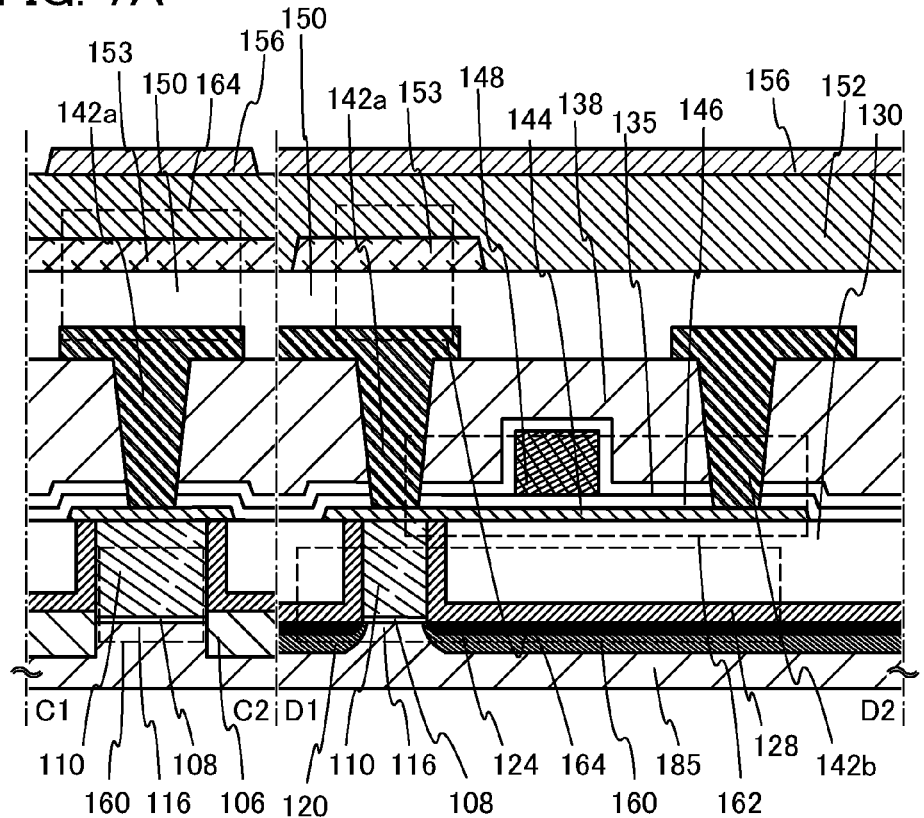
FIGS. 7A to 7C are a cross-sectional view, a plan view, and a circuit diagram illustrating one embodiment of a semiconductor device.
Figure 7B:
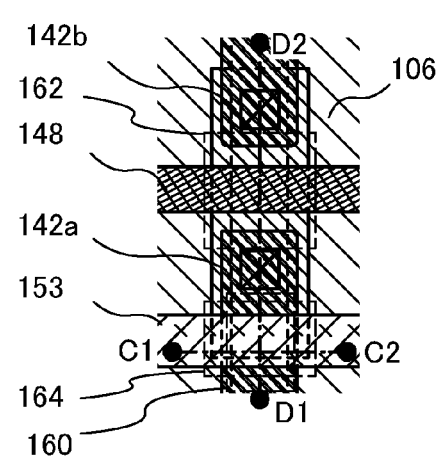
Figure 7C:
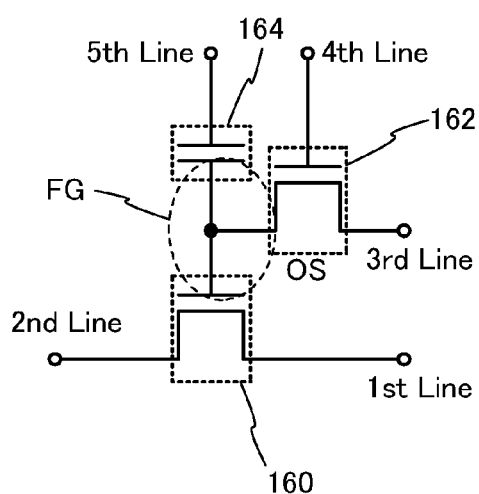

FIGS. 7A to 7C illustrate an example of a structure of the semiconductor device. FIG. 7A is a cross-sectional view of the semiconductor device, FIG. 7B is a plan view of the semiconductor device, and FIG. 7C is a circuit diagram of the semiconductor device. Here, FIG. 7A corresponds to a cross section taken along the line C1-C2 and the line D1-D2 in FIG. 7B.

The semiconductor device illustrated in FIGS. 7A and 7B includes a transistor 160 including a first semiconductor material in a lower portion, and a transistor 162 including a second semiconductor material in an upper portion. Here, the structure of the transistor 420 described in Embodiment 1 is applied to the transistor 162.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables holding of charge for a long time owing to its characteristics.

Although all the transistors are n-channel transistors here, p-channel transistors may be applied. Further, as long as a transistor like that described in Embodiment 1 or Embodiment 2, each including an oxide semiconductor for holding data, is used, it is not necessary to limit a specific structure of the semiconductor device, such as a material of the semiconductor device or a structure of the semiconductor device, to the structure described here.

The transistor 160 in FIG. 7A includes a channel formation region 116 provided in a substrate 185 including a semiconductor material (e.g., silicon), impurity regions 120 so that the channel formation region 116 is provided therebetween, intermetallic compound regions 124 in contact with the impurity regions 120, a gate insulating film 108 provided over the channel formation region 116, and a gate electrode layer 110 provided over the gate insulating film 108. Note that a transistor whose source electrode layer and drain electrode layer are not illustrated in a drawing may also be referred to as a transistor for the sake of convenience. Further, in such a case, in description of a connection of a transistor, a source region and a source electrode layer are collectively referred to as a "source electrode layer", and a drain region and a drain electrode layer are collectively referred to as a "drain electrode layer". That is, in this specification, the term "source electrode layer" may include a source region.

An element isolation insulating layer 106 is provided over the substrate 185 to surround the transistor 160. An insulating layer 128 and an insulating layer 130 are provided to cover the transistor 160. Note that the insulating layer 130 functions as a base insulating layer of the transistor 162. Note that in the transistor 160, a sidewall insulating layer may be formed on a side surface of the gate electrode layer 110, and the impurity regions 120 may include a region having a different impurity concentration.

The transistor 160 formed using a single crystal semiconductor substrate can operate at high speed. Thus, when the transistor is used as a reading transistor, data can be read at a high speed. Two insulating films are formed so as to cover the transistor 160. As a treatment prior to formation of the transistor 162 and a capacitor 164, a CMP treatment is performed on the two insulating films, whereby the insulating layer 128 and the insulating layer 130 which are planarized are formed and, at the same time, an upper surface of the gate electrode layer 110 is exposed.

As the insulating layer 128 and the insulating layer 130, typically, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used. The insulating layer 128 and the insulating layer 130 can be formed by a plasma-enhanced CVD method, a sputtering method, or the like, and are preferably formed by a plasma-enhanced CVD method.

Note that in this embodiment, a silicon nitride film is used as the insulating layer 128 and a silicon oxide film is used as the insulating layer 130.

A planarization treatment is preferably performed on the surface of the insulating layer 130, on which an oxide semiconductor layer 144 is to be formed. In this embodiment, the oxide semiconductor layer 144 is formed over the insulating layer 130 which is planarized sufficiently (preferably, an average surface roughness of the insulating layer 130 is less than or equal to 0.15 nm) by a polishing treatment (e.g., a CMP treatment).

Since the insulating layer 130 functions as a base insulating layer of the transistor 162, after the formation of the insulating layer 130, a dehydration or dehydrogenation treatment and a subsequent oxygen doping treatment are performed at least once on the insulating layer 130. Thus, on the surface of the base insulating layer whose water and hydrogen contents are decreased and whose oxygen content is increased, the oxide semiconductor layer 144 can be formed. Moreover, the reliability of the transistor 162 including the oxide semiconductor layer 144 provided over the insulating layer 130 can be improved.

The dehydration or dehydrogenation treatment and the subsequent oxygen doping treatment which are performed on the insulating layer 130 may be performed before or after the step of exposing the gate electrode layer 110 of the transistor 160, or the both. Alternatively, the following order may be employed: the dehydration or dehydrogenation treatment is performed on the insulating layer 130, the gate electrode layer 110 is exposed, and then the oxygen doping treatment is performed thereon. Note that at the time of performing the oxygen doping treatment on the insulating layer 130, it is preferable to use a mask covering a region which overlaps with the gate electrode layer 110. In the case where the oxygen doping treatment is performed before the step of exposing the gate electrode layer 110, the condition for the oxygen introduction is controlled so that oxygen is introduced into a region below the region polished by a CMP treatment.

The transistor 162 illustrated in FIG. 7A includes an oxide semiconductor in a channel formation region and a gate electrode layer 148 which overlaps with the oxide semiconductor layer 144 with a gate insulating layer 146 provided therebetween. Here, it is preferable that the oxide semiconductor layer 144 included in the transistor 162 be highly purified. By using a highly purified oxide semiconductor, the transistor 162 can have extremely favorable off-state current characteristics.

Since the off-state current of the transistor 162 is small, stored data can be held for a long time owing to such a transistor. In other words, power consumption can be sufficiently reduced because a semiconductor storage device in which refresh operation is unnecessary or the frequency of refresh operation is extremely low can be provided.

An insulating layer 135 and an insulating layer 138 each having a single-layer structure or a layered structure are provided over the transistor 162. In this embodiment, an aluminum oxide film is used as the insulating layer 135. Providing an aluminum oxide film having high density (film density: 3.2 g/cm$^3$ or higher, preferably 3.6 g/cm$^3$ or higher) can stabilize the electric characteristics of the transistor 162.

In addition, an electrode layer 142a and an electrode layer 142b which are in contact with the oxide semiconductor layer 144 through openings provided in the gate insulating layer 146, the insulating layer 135, and the insulating layer 138 are formed. The electrode layer 142a and the electrode layer 142b each function as a source electrode layer or a drain electrode layer of the transistor 162.

Further, an insulating layer 150 having a single-layer structure or a layered structure is provided over the electrode layer 142a and the electrode layer 142b. Furthermore, a conductive layer 153 is provided in a region which overlaps with the electrode layer 142a of the transistor 162 with the insulating layer 150 provided therebetween, and the electrode layer 142a, the insulating layer 150, and the conductive layer 153 form the capacitor 164. That is, the electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

An insulating layer 152 is provided over the transistor 162 and the capacitor 164. In addition, a wiring 156 for connecting the transistor 162 to another transistor is provided over the insulating layer 152. Although not illustrated in FIG. 7A, the wiring 156 is electrically connected to the electrode layer 142b through an opening provided in the insulating layer 150, the insulating layer 152, and the like (or through an electrode layer formed in the opening).

In FIGS. 7A and 7B, the transistor 160 and the transistor 162 are provided so as to at least partly overlap each other, and a source region or a drain region of the transistor 160 is preferably provided to partly overlap with the oxide semiconductor layer 144. In addition, the transistor 162 and the capacitor 164 are provided so as to overlap with at least part of the transistor 160. For example, the conductive layer 153 of the capacitor 164 is provided to at least partly overlap with the gate electrode layer 110 of the transistor 160. When such a planar layout is employed, the area occupied by the semiconductor device can be reduced; thus, the degree of integration can be increased.

Next, an example of a circuit configuration corresponding to FIGS. 7A and 7B is illustrated in FIG. 7C.

In FIG. 7C, a first wiring (1st Line) is electrically connected to a source electrode layer of the transistor 160, and a second wiring (2nd Line) is electrically connected to a drain electrode layer of the transistor 160. A third wiring (3rd Line) and one of the source electrode layer and the drain electrode layer of the transistor 162 are electrically connected to each other, and a fourth wiring (4th Line) and the gate electrode layer of the transistor 162 are electrically connected to each other. The gate electrode layer of the transistor 160 and the other of the source electrode layer and the drain electrode layer of the transistor 162 are electrically connected to one electrode of the capacitor 164. A fifth wiring (5th Line) is electrically connected to the other electrode of the capacitor 164.

The semiconductor device illustrated in FIG. 7C utilizes a characteristic in which the potential of the gate electrode layer of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is given to the gate electrode layer of the transistor 160 (writing). Here, one of two kinds of charge providing different potentials (hereinafter referred to as a low-level charge and a high-level charge) is given. After that, the potential of the fourth wiring is set to a potential at which the transistor 162 is turned off, so that the transistor 162 is turned off. Thus, the charge given to the gate electrode layer of the transistor 160 is held (storing).

Since the off-state current of the transistor 162 is extremely low, the charge of the gate electrode layer of the transistor 160 is held for a long time.

Next, reading of data will be described. By supplying an appropriate potential (a reading potential) to the fifth wiring while a predetermined potential (a constant potential) is supplied to the first wiring, the potential of the second wiring varies depending on the amount of charge held in the gate electrode layer of the transistor 160. This is because in general, when the transistor 160 is an n-channel transistor, an apparent threshold voltage $V_{th\_H}$ in the case where a high-level charge is given to the gate electrode layer of the transistor 160 is lower than an apparent threshold voltage $V_{th\_L}$ in the case where a low-level charge is given to the gate electrode layer of the transistor 160. Here, an apparent threshold voltage refers to the potential of the fifth wiring, which is needed to turn on the transistor 160. Thus, the potential of the fifth wiring is set to a potential $V_0$ which is between $V_{th\_H}$ and $V_{th\_L}$, whereby charge given to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed to be used, only data of desired memory cells needs to be read. In the case where such reading is not performed, a potential at which the transistor 160 is turned off regardless of the state of the gate electrode layer thereof, that is, a potential smaller than $V_{th\_H}$ may be given to the fifth wiring. Alternatively, a potential at which the transistor 160 is turned on regardless of the state of the gate electrode layer thereof, that is, a potential higher than $V_{th\_L}$ may be applied to the fifth wiring.

When a transistor having a channel formation region formed using an oxide semiconductor and having extremely low off-state current is applied to the semiconductor device in this embodiment, the semiconductor device can hold stored data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate; thus, a problem such as deterioration of a gate insulating layer does not arise at all. In other words, the semiconductor device according to the disclosed invention does not have a limitation on the number of write cycles, which has been problematic in a conventional nonvolatile memory, and reliability thereof is drastically improved. Furthermore, data is written depending on the on state or the off state of the transistor, whereby high-speed operation can be easily achieved.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

Embodiment 4

In this embodiment, a semiconductor device including the transistor described in Embodiment 1 or 2, which can hold stored data even when not powered, which does not have a limitation on the number of write cycles, and which has a structure different from the structure described in Embodiment 3 will be described with reference to FIGS. 8A and 8B and FIGS. 9A and 9B.

Figure 8A:
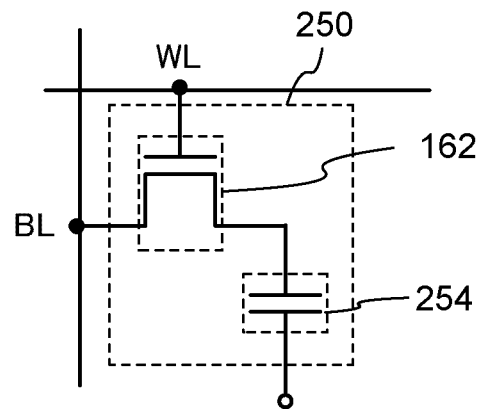
FIGS. 8A and 8B are a circuit diagram and a perspective view illustrating one embodiment of a semiconductor device.
Figure 8B:
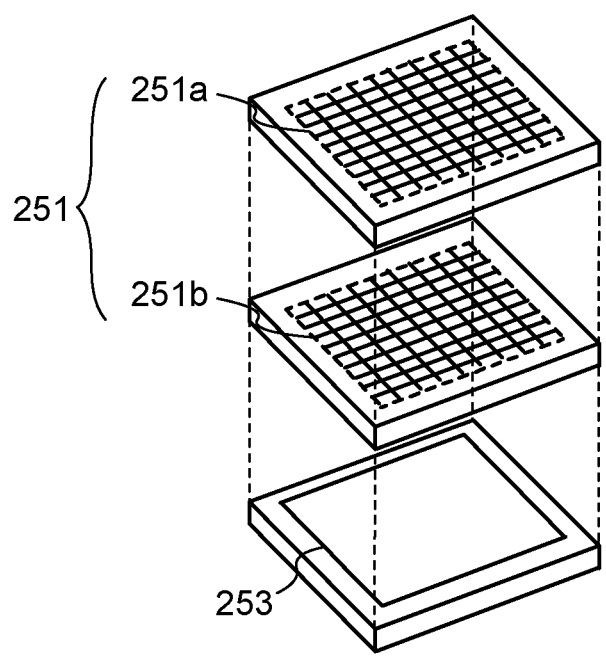

FIG. 8A illustrates an example of a circuit configuration of the semiconductor device, and FIG. 8B is a conceptual diagram illustrating an example of the semiconductor device. First, the semiconductor device illustrated in FIG. 8A will be described, and then, the semiconductor device illustrated in FIG. 8B will be described.

In the semiconductor device illustrated in FIG. 8A, a bit line BL is electrically connected to the source electrode layer or the drain electrode layer of the transistor 162, a word line WL is electrically connected to the gate electrode layer of the transistor 162, and the source electrode layer or the drain electrode layer of the transistor 162 is electrically connected to a first terminal of a capacitor 254.

Next, writing and holding of data in the semiconductor device (a memory cell 250) illustrated in FIG. 8A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

The transistor 162 including an oxide semiconductor has extremely low off-state current. For that reason, a potential of the first terminal of the capacitor 254 (or a charge accumulated in the capacitor 254) can be held for an extremely long period by turning off the transistor 162.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 8A can hold charge that is accumulated in the capacitor 254 for a long time because the off-state current of the transistor 162 is extremely low. In other words, power consumption can be sufficiently reduced because refresh operation becomes unnecessary or the frequency of refresh operation can be extremely low. Moreover, stored data can be held for a long period even when power is not supplied.

Next, the semiconductor device illustrated in FIG. 8B will be described.

The semiconductor device illustrated in FIG. 8B includes a memory cell array 251a and a memory cell array 251b including a plurality of memory cells 250 illustrated in FIG. 8A as memory circuits in the upper portion, and a peripheral circuit 253 in the lower portion, which is necessary for operating a memory cell array 251 (memory cell arrays 251a and 251b). Note that the peripheral circuit 253 is electrically connected to the memory cell array 251.

In the structure illustrated in FIG. 8B, the peripheral circuit 253 can be provided under the memory cell array 251 (memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Further, with the transistor, a variety of circuits (such as a logic circuit or a driver circuit) which are required to operate at high speed can be achieved favorably.

Note that FIG. 8B illustrates, as an example, the semiconductor device in which two memory cell arrays 251 (memory cell arrays 251a and 251b) are stacked; however, the number of memory cell arrays to be stacked is not limited thereto. Three or more memory cell arrays may be stacked.

Next, a specific structure of the memory cell 250 illustrated in FIG. 8A will be described with reference to FIGS. 9A and 9B.

Figure 9A:
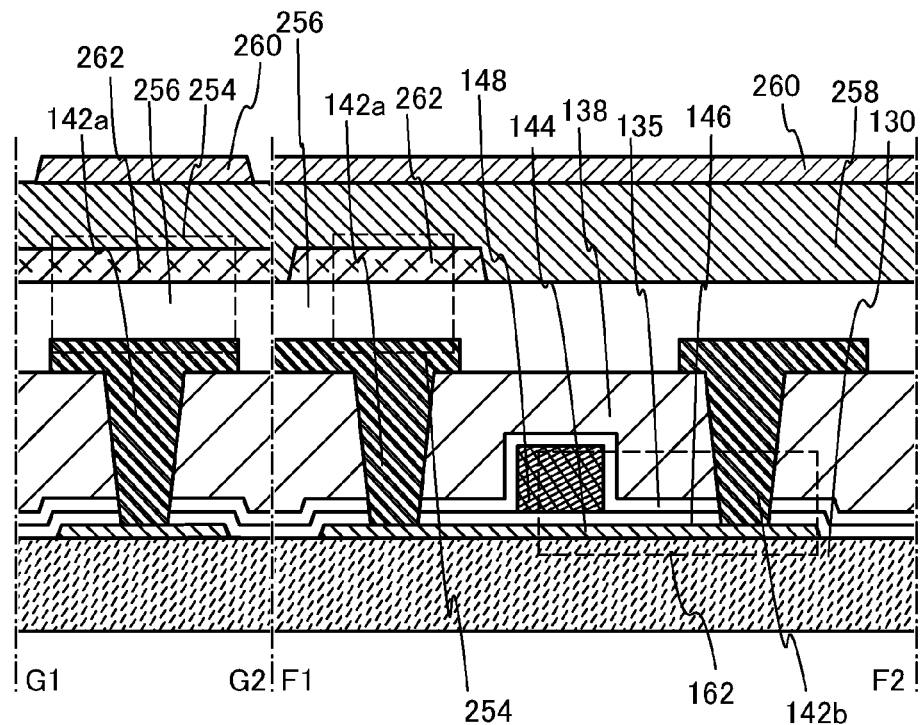
FIGS. 9A and 9B are a cross-sectional view and a plan view illustrating one embodiment of a semiconductor device.
Figure 9B:
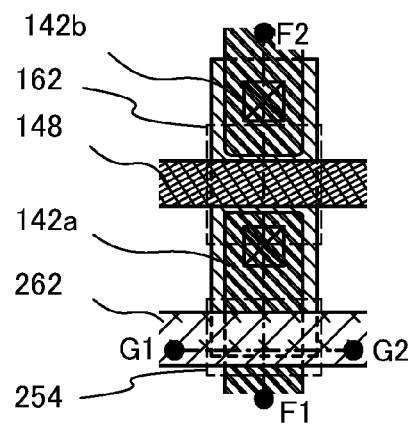

FIGS. 9A and 9B illustrate a structure example of the memory cell 250. FIG. 9A is a cross-sectional view of the memory cell 250, and FIG. 9B is a plan view of the memory cell 250. Here, FIG. 9A corresponds to cross sections taken along the lines F1-F2 and G1-G2 in FIG. 9B.

In this embodiment, the transistor 162 includes the insulating layer 130, the oxide semiconductor layer 144 over the insulating layer 130, the gate insulating layer 146 over the oxide semiconductor layer 144, and the gate electrode layer 148 which overlaps with the oxide semiconductor layer 144 with the gate insulating layer 146 provided therebetween. In addition, the insulating layer 135 and the insulating layer 138 covering the transistor 162 are formed, and the electrode layer 142a and the electrode layer 142b which are connected to the oxide semiconductor layer 144 through the openings provided in the gate insulating layer 146, the insulating layer 135, and the insulating layer 138 are formed.

The transistor 162 illustrated in FIGS. 9A and 9B can have a structure similar to the structure of the transistor described in Embodiment 1 or Embodiment 2. Since the insulating layer 130 which functions as a base insulating layer of the transistor 162 is subjected to at least once a dehydration or dehydrogenation treatment and a subsequent oxygen doping treatment so that water and hydrogen contents thereof are decreased and an oxygen content thereof is increased, the reliability of the transistor 162 including the oxide semiconductor layer 144 provided over the insulating layer 130 can be improved.

An insulating layer 256 having a single-layer structure or a layered structure is provided over the transistor 162. Furthermore, a conductive layer 262 is provided in a region which overlaps with the electrode layer 142a of the transistor 162 with the insulating layer 256 provided therebetween, and the electrode layer 142a, the insulating layer 256, and the conductive layer 262 form the capacitor 254. That is, the electrode layer 142a of the transistor 162 functions as one electrode of the capacitor 254, and the conductive layer 262 functions as the other electrode of the capacitor 254.

An insulating layer 258 is provided over the transistor 162 and the capacitor 254. Further, a wiring 260 for connecting the memory cell 250 to an adjacent memory cell 250 is provided over the insulating layer 258. Although not illustrated, the wiring 260 is electrically connected to the electrode layer 142b of the transistor 162 through an opening provided in the insulating layer 256, the insulating layer 258, and the like. The wiring 260 may be electrically connected to the electrode layer 142b through another conductive layer provided in the opening. Note that the wiring 260 corresponds to the bit line BL in the circuit diagram of FIG. 8A.

In FIGS. 9A and 9B, the electrode layer 142b of the transistor 162 can also function as a source electrode layer of a transistor included in an adjacent memory cell.

When the planar layout illustrated in FIGS. 9A and 9B is employed, the area occupied by the semiconductor device can be reduced; thus, the degree of integration can be increased.

As described above, the plurality of memory cells formed in multiple layers in the upper portion each include a transistor including an oxide semiconductor. Since the off-state current of the transistor including an oxide semiconductor is small, stored data can be held for a long time owing to such a transistor. In other words, power consumption can be sufficiently reduced because the frequency of refresh operation can be extremely low.

In such a manner, a semiconductor device having a novel feature can be obtained by being provided with both a peripheral circuit including a transistor including a material other than an oxide semiconductor (in other words, a transistor capable of operating at sufficiently high speed) and a memory circuit including a transistor including an oxide semiconductor (in a broader sense, a transistor whose off-state current is sufficiently low). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

Embodiment 5

In this embodiment, examples of application of the semiconductor device described in any of the above embodiments to portable devices such as cellular phones, smartphones, or e-book readers will be described with reference to FIGS. 10A and 10B, FIG. 11, FIG. 12, and FIG. 13.

In portable devices such as a mobile phone, a smartphone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 10A:
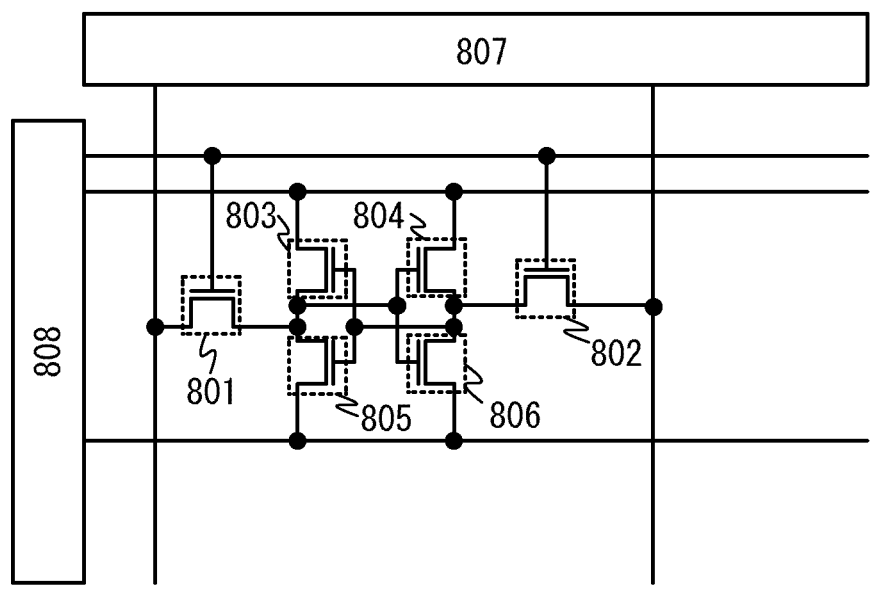
FIGS. 10A and 10B are circuit diagrams each illustrating one embodiment of a semiconductor device.

As illustrated in FIG. 10A, in an ordinary SRAM, one memory cell includes six transistors, that is, transistors 801 to 806, which are driven with an X decoder 807 and a Y decoder 808. A pair of the transistors 803 and 805 and a pair of the transistors 804 and 806 each serve as an inverter, and high-speed driving can be performed therewith. However, since one memory cell includes six transistors, there is a disadvantage that the cell area is large. Provided that the minimum feature size of a design rule is F, the area of a memory cell in an SRAM is generally 100 $F^2$ to 150 $F^2$. Therefore, a price per bit of an SRAM is the highest among a variety of memory devices.

Figure 10B:
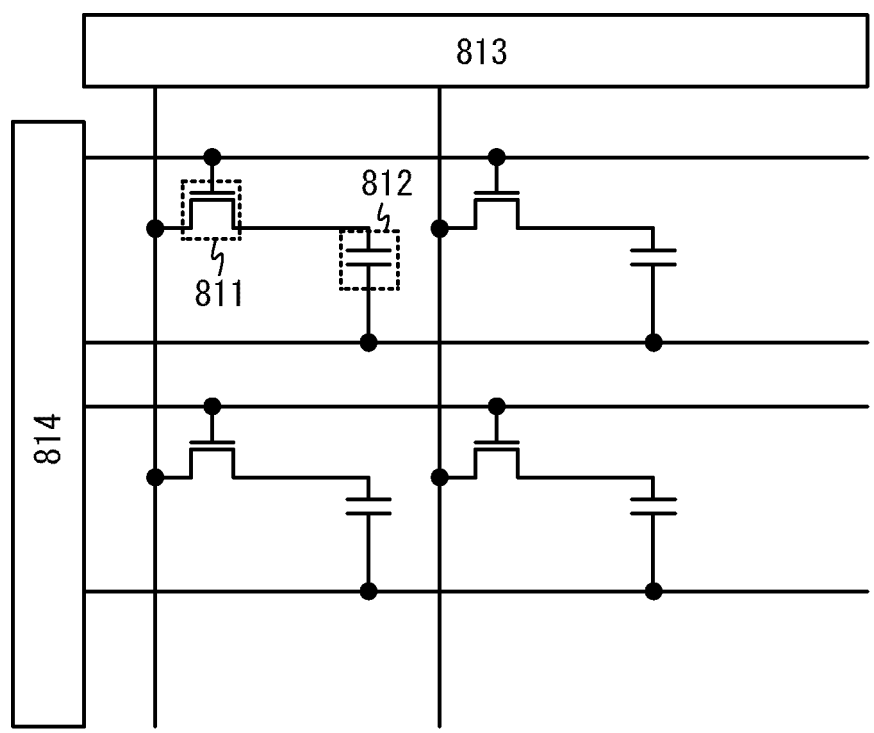

As illustrated in FIG. 10B, in a DRAM, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in the above embodiments is about 10 $F^2$ and frequent refreshing is not needed. Therefore, the area of the memory cell is reduced, and the power consumption can be reduced.

Figure 11:
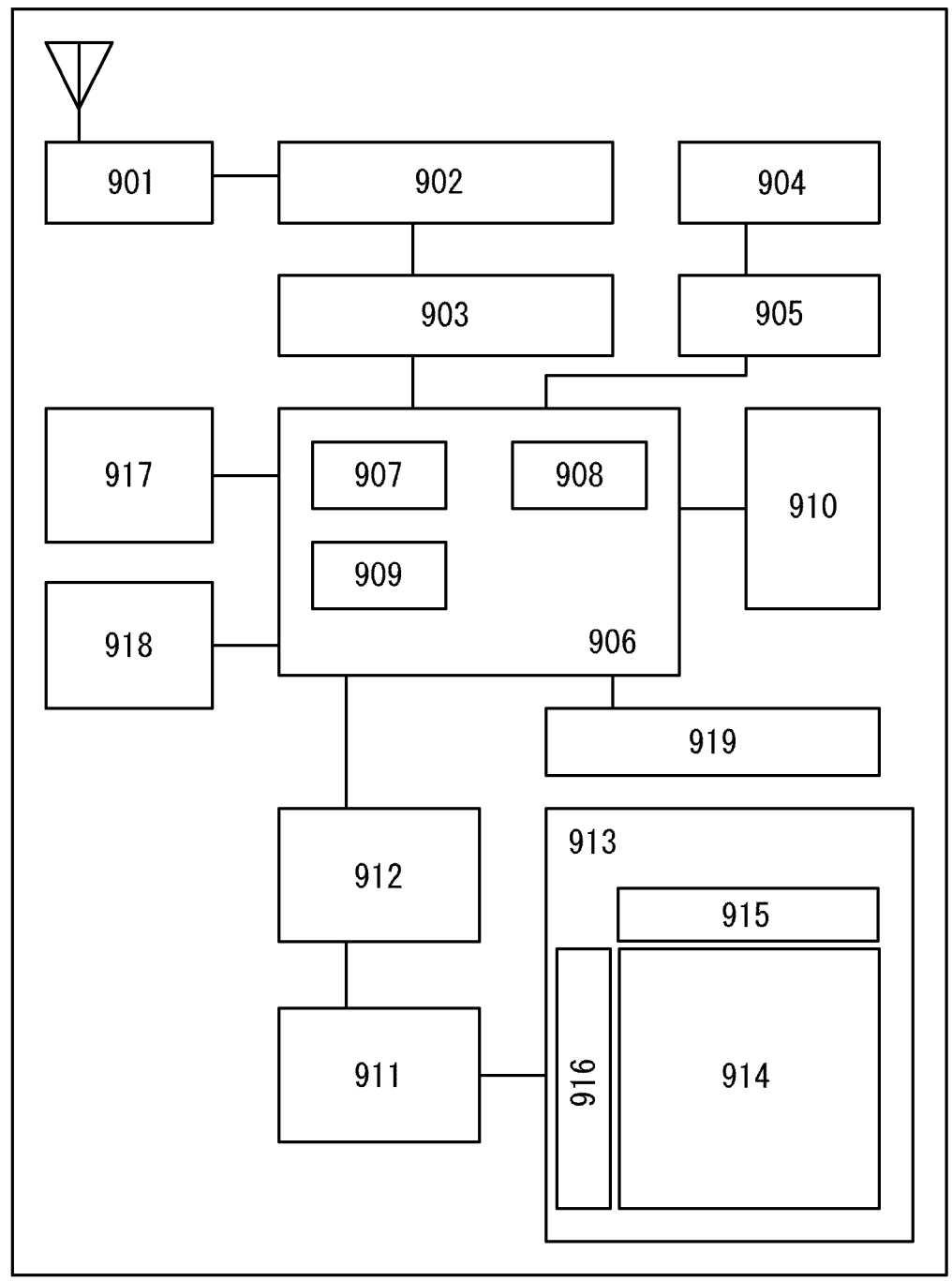
FIG. 11 is a block diagram illustrating one embodiment of a semiconductor device.

Next, FIG. 11 is a block diagram of a portable device. The portable device illustrated in FIG. 11 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, stored data can be held for a long time, and power consumption can be sufficiently reduced.

Figure 12:
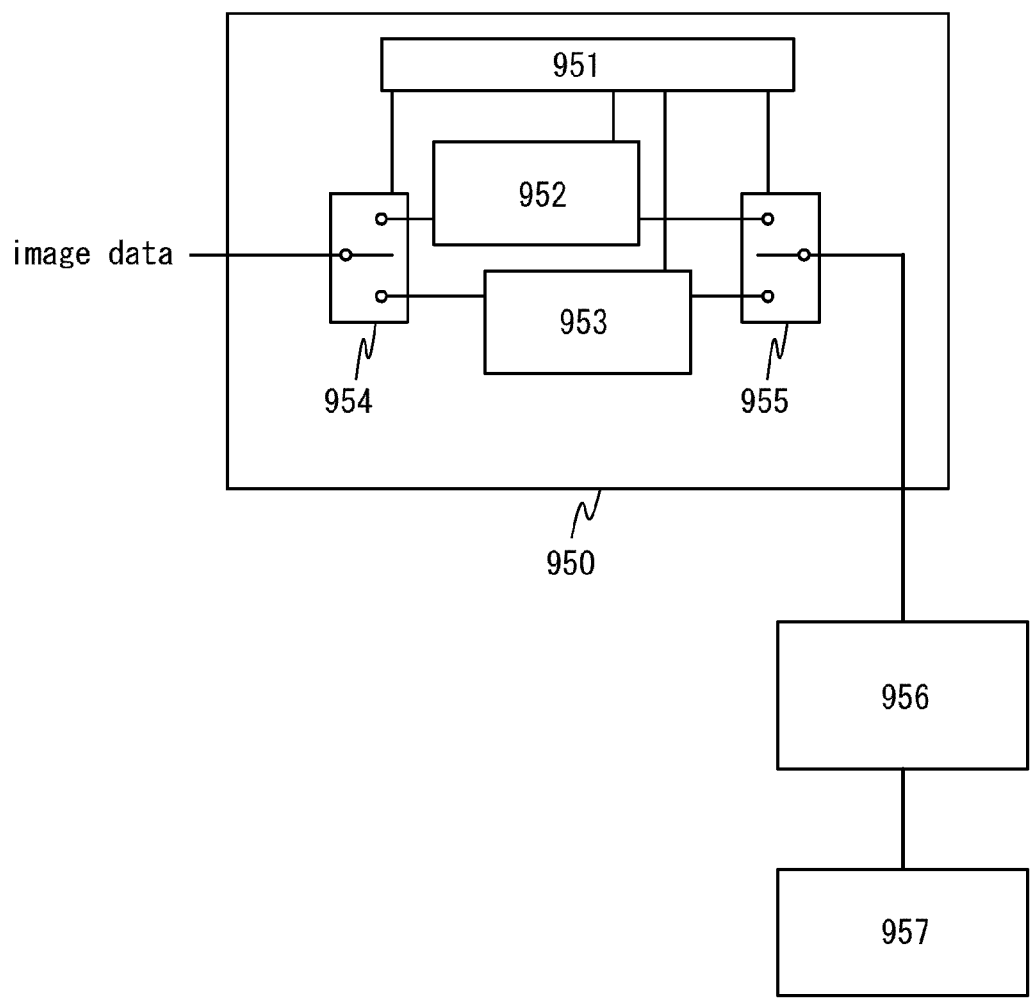
FIG. 12 is a block diagram illustrating one embodiment of a semiconductor device.

FIG. 12 illustrates an example of using the semiconductor device described in any of the above embodiments in a memory circuit 950 for a display. The memory circuit 950 illustrated in FIG. 12 includes a memory 952, a memory 953, a switch 954, a switch 955, and a memory controller 951. Further, the memory circuit is connected to a display controller 956 which reads and controls image data input through a signal line (input image data) and data stored in the memory 952 and the memory 953 (stored image data), and is also connected to a display 957 which displays an image based on a signal from the display controller 956.

First, image data (input image data A) is formed by an application processor (not illustrated). The input image data A is stored in the memory 952 through the switch 954. The image data (stored image data A) stored in the memory 952 is transmitted to the display 957 through the switch 955 and the display controller 956 and is displayed on the display 957.

In the case where the input image data A is not changed, the stored image data A is read from the memory 952 through the switch 955 by the display controller 956 normally at a frequency of 30 Hz to 60 Hz.

Next, for example, when data displayed on the screen is rewritten by a user (i.e., in the case where the input image data A is changed), new image data (input image data B) is formed by the application processor. The input image data B is stored in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and stored data can be held for a long time, and power consumption can be sufficiently reduced.

Figure 13:
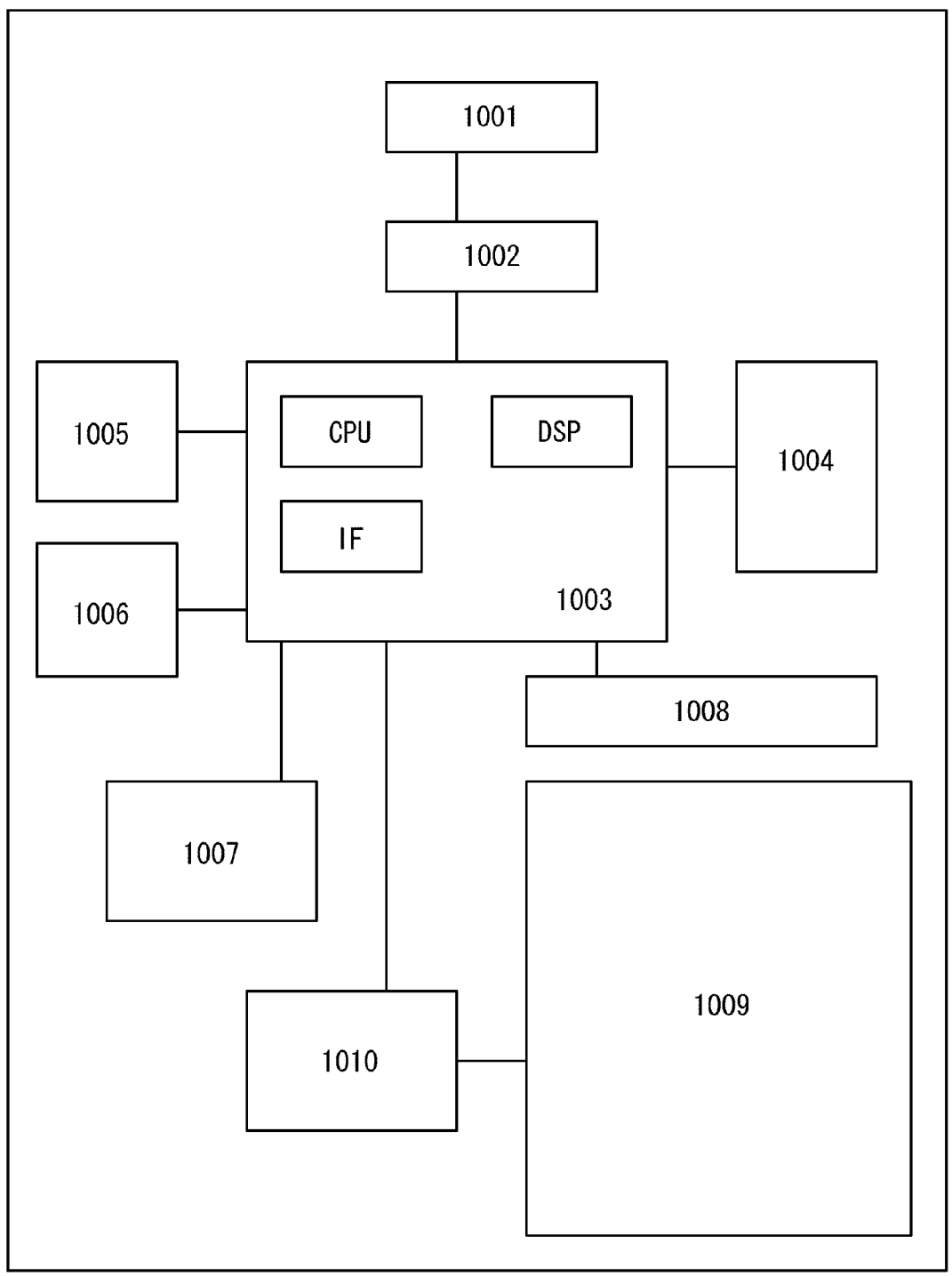
FIG. 13 is a block diagram illustrating one embodiment of a semiconductor device.

FIG. 13 is a block diagram of an e-book reader. The e-book reader in FIG. 13 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 13. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding data of a place specified by users. In order to save the data for a long time, the data may be copied into the flash memory 1004. Even in such a case, by employing the semiconductor device described in any of the above embodiments, writing and reading of data can be performed at high speed, stored data can be held for a long time, and power consumption can be sufficiently reduced.

As described above, the semiconductor device in any of the above embodiments is mounted on each of the portable devices described in this embodiment. Therefore, it is possible to obtain a portable device which is capable of reading data at high speed, holding stored data for a long time, and reducing power consumption.

The methods and structures described in this embodiment can be combined as appropriate with any of the methods and structures described in the other embodiments.

Example

In this example, the transistor described in any of the above embodiments was fabricated, and the electric characteristics were evaluated.

A method for fabricating a transistor of this example (hereinafter also referred to as an example transistor) will be described below.

First, a silicon nitride oxide film having a thickness of 300 nm was formed as a base insulating layer over a silicon substrate by a plasma-enhanced CVD method.

Next, by a CMP treatment performed on the surface of the base insulating layer, the surface of the base insulating layer, on which an oxide semiconductor layer was to be formed, was planarized. The conditions of the CMP treatment were set as follows: polishing pad for CMP, polyurethane-based polishing cloth; slurry, NP8020 (produced by Nitta Haas Incorporated) in undiluted form (a grain size of silica of 60 nm to 80 nm); slurry temperature, room temperature; polishing pressure, 0.001 MPa; the number of rotations of a table where the polishing cloth was fixed, 60 rpm; and the number of spindle rotations on a side where the substrate was fixed, 56 rpm.

Next, as a dehydration or dehydrogenation treatment of the base insulating layer, the base insulating layer was heated at 650° C. under a vacuum atmosphere for an hour.

After that, oxygen ions were implanted by an ion implantation method into the base insulating layer subjected to the dehydration or dehydrogenation treatment. The conditions of the oxygen ion implantation were set as follows: acceleration voltage, 50 kV; dosage, $2.0 \times 10^{16}$ ions/cm$^2$; tilt angle, 7°; and twist angle, 72°.

Next, as an oxide semiconductor layer, an IGZO film having a thickness of 20 nm was formed by a sputtering method over the base insulating layer with the use of an oxide target having a composition ratio of In:Ga:Zn=3:1:2 [atomic ratio]. Deposition conditions were set as follows: mixed atmosphere containing argon and oxygen, Ar: $O_2$=30 sccm: 15 sccm; pressure, 0.4 Pa; electric power, 0.5 kW; and substrate temperature, 200° C.

The formed oxide semiconductor layer was processed into an island shape by an inductively coupled plasma (ICP) etching method. Etching conditions were set as follows: etching gas, a mixed gas of boron trichloride and chlorine ($BCl_3$:$Cl_2$=60 sccm:20 sccm); electric power, 450 W; bias power, 100 W; and pressure, 1.9 Pa.

Next, as a gate insulating layer, a silicon nitride oxide film having a thickness of 20 nm was deposited by a plasma-enhanced CVD method over the island-shaped oxide semiconductor layer. The deposition temperature of the gate insulating layer was set at 400° C.

A gate electrode layer was formed by stacking a tantalum nitride film having a thickness of 30 nm and a tungsten film having a thickness of 135 nm, which were deposited by a sputtering method, over the gate insulating layer and then processing the stack by an etching method. Deposition conditions of the tantalum nitride film were set as follows: mixed atmosphere containing argon and nitrogen, $Ar:N_2=50$ sccm: 10 sccm; pressure, 0.6 Pa; and electric power, 1 kW. Deposition conditions of the tungsten film were set as follows: argon atmosphere, Ar=100 sccm; pressure, 2.0 Pa; electric power, 4 kW; and heated argon gas which was introduced to heat the substrate, 10 sccm.

The tantalum nitride film and the tungsten film were subjected to first to third etching. The first etching was performed under the following conditions: etching gas, a mixed gas of chlorine, carbon tetrafluoride, and oxygen $(Cl_2:CF_4:O_2=45$ sccm:55 sccm:55 sccm); electric power, 3 kW; bias power, 110 W; pressure, 0.67 Pa; and substrate temperature, 40° C. Accordingly, the tungsten film was etched. After that, the second etching was performed for 15 seconds under the following conditions: etching gas, a chlorine gas $(Cl_2=100$ sccm); electric power, 2 kW; bias power, 50 W; pressure, 1.0 Pa; and substrate temperature, −10° C. Then, the third etching was performed for 50 seconds under the following conditions: etching gas, a chlorine gas $(Cl_2=100$ sccm); electric power, 1 kW; bias power, 25 W; pressure, 2.0 Pa; and substrate temperature, −10° C. Accordingly, the tantalum nitride film was etched.

Next, phosphorus (P) ion implantation was performed on the oxide semiconductor layer by an ion implantation method with the use of the gate electrode layer as a mask, so that a pair of low-resistance regions and a channel formation region were formed in a self-aligned manner. The conditions of the phosphorus (P) ion implantation were set as follows: acceleration voltage, 30 kV; dosage, $1.0 \times 10^{15}$ ions/cm$^2$; tilt angle, 7°; and twist angle, 72°.

Next, as an interlayer insulating layer, an aluminum oxide film and a silicon nitride oxide film were stacked over the gate electrode layer. The aluminum oxide film was deposited by a sputtering method, and deposition conditions were set as follows: mixed atmosphere containing argon and oxygen, $Ar:O_2=25$ sccm:25 sccm; pressure, 0.4 Pa; electric power, 2.5 kW; and substrate temperature, 250° C. The thickness of the aluminum oxide film was set to 70 nm. The silicon nitride oxide film was deposited to a thickness of 350 nm by a plasma-enhanced CVD method.

After the interlayer insulating layer was formed, a heat treatment was performed at 400° C. under an oxygen atmosphere for an hour.

After that, a first opening that reaches one of the low-resistance regions of the oxide semiconductor layer was formed in the interlayer insulating layer and the gate insulating layer. First etching was performed for 148 seconds and then second etching was performed for 84 seconds to form the first opening. The first etching conditions were set as follows: etching gas, a mixed gas of trifluoromethane and helium $(CHF_3:He=7.5$ sccm:142.5 sccm); electric power, 475 W; bias power, 300 W; and pressure, 5.5 Pa. The second etching conditions were set as follows: etching gas, a mixed gas of trifluoromethane and helium $(CHF_3:He=7.5$ sccm:142.5 sccm); electric power, 475 W; bias power, 150 W; and pressure, 5.5 Pa.

After a resist mask is removed by $O_2$ ashing (performed at an electric power of 200 W and a pressure of 0.5 Torr for 120 seconds), a second opening that reaches the other of the low-resistance regions of the oxide semiconductor layer was formed in the interlayer insulating layer and the gate insulating layer with a new resist mask. Etching for forming the second opening was performed under the same conditions as the etching for forming the first opening.

After the resist mask was removed by $O_2$ ashing (performed at an electric power of 200 W and a pressure of 0.5 Torr for 120 seconds), a tungsten film was formed to a thickness of 600 nm over the interlayer insulating layer so as to cover the first opening and the second opening. The tungsten film was deposited by a sputtering method, and deposition conditions were set as follows: argon atmosphere, Ar=80 sccm; pressure, 0.8 Pa; electric power, 1 kW; and heated argon gas which was introduced to heat the substrate, 10 sccm.

Next, a CMP treatment was performed on the formed tungsten film, and at least a region of the tungsten film, which overlaps with the gate electrode layer, was removed to form a source electrode layer and a drain electrode layer. The conditions of the CMP treatment were set as follows: polishing pad for CMP, a polyurethane-based polishing cloth; slurry, 1000 ml of SSW2000 (produced by Cabot Corporation) to which 135 ml of an hydrogen peroxide solution was added; slurry temperature, room temperature; polishing pressure, 0.01 MPa; the number of rotations of a table where the polishing cloth was fixed, 35 rpm; and the number of spindle rotations on a side where the substrate was fixed, 39 rpm.

Next, a titanium film having a thickness of 50 nm, an aluminum film having a thickness of 100 nm, and a titanium film having a thickness of 50 nm were deposited by a sputtering method over the source electrode layer and the drain electrode layer. Deposition conditions of the titanium films were set as follows: argon atmosphere (Ar=20 sccm); pressure, 0.1 Pa; electric power, 12 kW; and deposition temperature, room temperature. Deposition conditions of the aluminum film were set as follows: argon atmosphere (Ar=50 sccm); pressure, 0.4 Pa; electric power, 1 kW; and deposition temperature, room temperature.

The stack of the titanium film, the aluminum film, and the titanium film was etched to form a source wiring layer and a drain wiring layer. Etching conditions were set as follows: etching gas, a mixed gas of boron trichloride and chlorine $(BCl_3:Cl_2=60$ sccm:20 sccm); electric power, 450 W; bias power, 100 W; and pressure, 1.9 Pa.

After that, a polyimide film was formed to a thickness of 1.5 μm by a coating method and subjected to a heat treatment at 300° C. under the atmospheric atmosphere for an hour.

Through the above process, the transistor of this example was fabricated.

As a comparative example, a comparison transistor 1 whose base insulating layer was subjected to neither a dehydration or dehydrogenation treatment nor an oxygen ion implantation treatment (oxygen doping treatment) and a comparison transistor 2 whose base insulating layer was not subjected to a dehydration or dehydrogenation treatment but subjected to an oxygen ion implantation treatment (oxygen doping treatment) were fabricated. The comparison transistor 1 was fabricated in a manner similar to that of the example transistor, except that the base insulating layer was subjected to neither the dehydration or dehydrogenation treatment nor the oxygen ion implantation treatment (oxygen doping treatment). The comparison transistor 2 was fabricated in a manner similar to that of the example transistor, except that the base insulating layer was not subjected to the dehydration or dehydrogenation treatment.

Note that in each of the example transistor, the comparison transistor 1, and the comparison transistor 2 which were fabricated in this example, a channel length (L) was set to 9.9 μm, a channel width (W) was set to 10 μm, and a distance between a gate electrode layer and a contact region of an oxide semiconductor layer and a source electrode layer (or a drain electrode layer) was set to 0.1 μm.

Figure 14A:
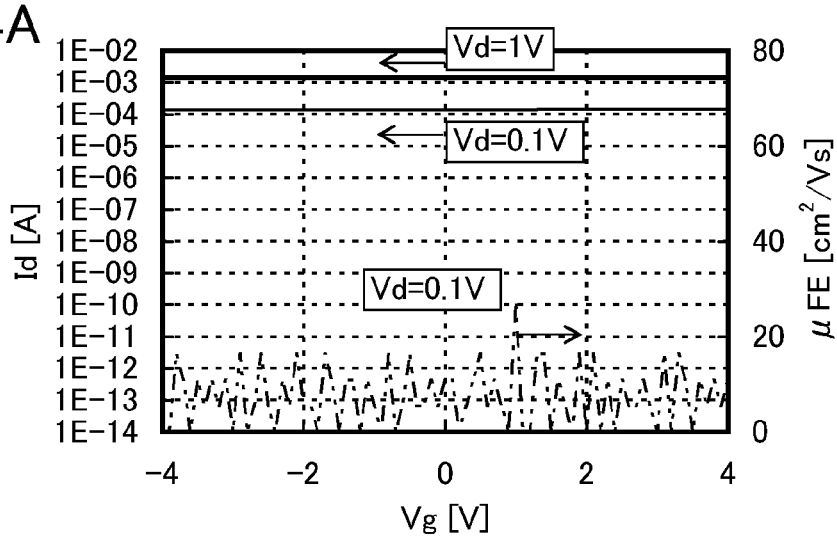
FIGS. 14A to 14C show evaluation results of electric characteristics of transistors manufactured in Example.
Figure 14B:
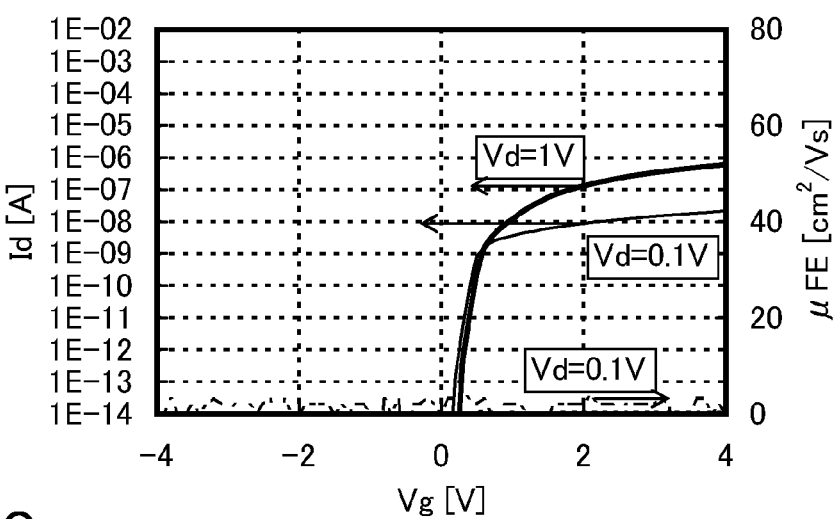
Figure 14C:
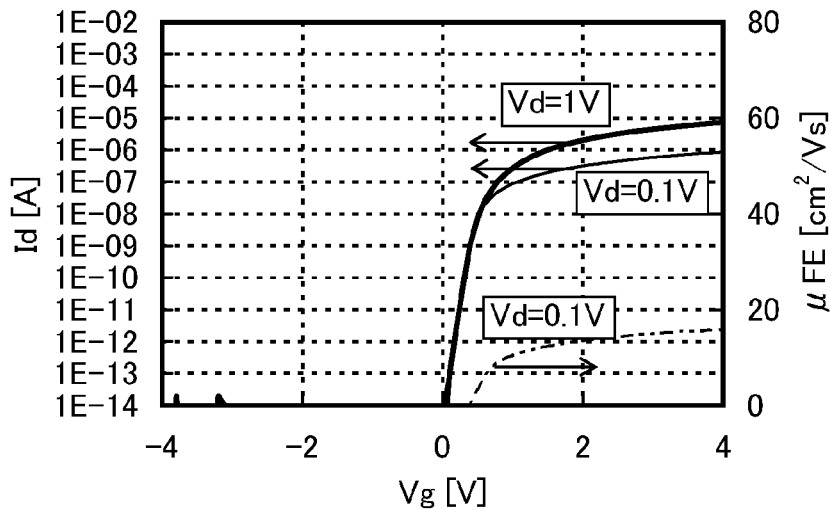

The evaluation results of the electric characteristics of the transistors which were fabricated are shown in FIGS. 14A to 14C.

Electric characteristics shown in FIGS. 14A to 14C are measurement results of values of a drain current (Id: [A]) and a field-effect mobility (μFE: [cm$^2$/Vs]) when a drain voltage (Vd) was set to 1 V or 0.1 V and a gate voltage (Vg) was set to range from −4 V to 4 V. Note that a drain voltage (Vd) refers to a potential difference between a drain and a source when the potential of the source is used as a reference potential.

FIG. 14A shows the evaluation result of the electric characteristics of the comparison transistor 1, FIG. 14B shows the evaluation result of the electric characteristics of the comparison transistor 2, and FIG. 14C shows the evaluation result of the electric characteristics of the example transistor.

As shown in FIG. 14A, in the comparison transistor 1 whose base insulating layer was not subjected to an oxygen doping treatment, electric characteristics as a switching element were not obtained. On the other hand, as shown in FIGS. 14B and 14C, the comparison transistor 2 and the example transistor whose base insulating layers were each subjected to an oxygen doping treatment exhibited electric characteristics as switching elements. Accordingly, the graphs showed that the transistors can have stable electric characteristics by the oxygen doping treatment performed on the respective base insulating layers.

The on-state current value of the comparison transistor 2 whose base insulating layer was not subjected to a dehydration or dehydrogenation treatment was lower than the example transistor and stopped increasing. Further, the field-effect mobility of the comparison transistor 2 was 0.7 cm$^2$/Vs when the drain voltage (Vd) was 0.1 V, whereas the field-effect mobility of the example transistor, which was as high as 16 cm$^2$/Vs, was obtained when the drain voltage (Vd) was 0.1 V. Accordingly, the graphs showed that the transistor can have stable electric characteristics by the dehydration or dehydrogenation treatment performed on the base insulating layer.

This application is based on Japanese Patent Application serial No. 2011-257633 filed with the Japan Patent Office on Nov. 25, 2011, the entire contents of which are hereby incorporated by reference.

What is claimed is:

1. A method for manufacturing a semiconductor device comprising the steps of:
    forming a base insulating layer over an insulating surface;
    performing a first heat treatment after forming the base insulating layer;
    performing an oxygen doping treatment by at least one of an ion implantation method, an ion doping method, and a plasma immersion ion implantation method after the first heat treatment;
    forming an oxide semiconductor layer over the base insulating layer after the oxygen doping treatment;
    forming a gate insulating layer over the oxide semiconductor layer; and
    forming a gate electrode layer over the gate insulating layer.

2. The method for manufacturing the semiconductor device according to claim 1, wherein the base insulating layer is formed by a plasma-enhanced chemical vapor deposition method.

3. The method for manufacturing the semiconductor device, according to claim 1, wherein the oxygen doping treatment is performed by using a linear ion beam.

4. The method for manufacturing the semiconductor device according to claim 1, wherein water contained in the base insulating layer is removed by performing the first heat treatment.

5. The method for manufacturing the semiconductor device according to claim 1, wherein hydrogen contained in the base insulating layer is removed by performing the first heat treatment.

6. The method for manufacturing the semiconductor device according to claim 1, wherein oxygen is supplied to the base insulating layer by performing the oxygen doping treatment.

7. The method for manufacturing the semiconductor device according to claim 1, further comprising the step of:
    performing a second heat treatment after forming the oxide semiconductor layer.

8. The method for manufacturing the semiconductor device according to claim 7, wherein oxygen is supplied to the oxide semiconductor layer from the base insulating layer by the second heat treatment.

9. A method for manufacturing a semiconductor device comprising the steps of:
    forming a base insulating layer over an insulating surface;
    performing a first oxygen doping treatment by at least one of an ion implantation method, an ion doping method, and a plasma immersion ion implantation method after forming the base insulating layer;
    performing a first heat treatment after performing the first oxygen doping treatment;
    performing a second oxygen doping treatment after performing the first heat treatment;
    forming an oxide semiconductor layer over the base insulating layer after the second oxygen doping treatment;
    forming a gate insulating layer over the oxide semiconductor layer; and
    forming a gate electrode layer over the gate insulating layer.

10. The method for manufacturing the semiconductor device according to claim 9, wherein the base insulating layer is formed by a plasma-enhanced chemical vapor deposition method.

11. The method for manufacturing the semiconductor device, according to claim 9, wherein the first oxygen doping treatment is performed by using a linear ion beam.

12. The method for manufacturing the semiconductor device according to claim 9, wherein water contained in the base insulating layer is removed by performing the first heat treatment.

13. The method for manufacturing the semiconductor device according to claim 9, wherein hydrogen contained in the base insulating layer is removed by performing the first heat treatment.

14. The method for manufacturing the semiconductor device according to claim 9, wherein oxygen is supplied to the base insulating layer by performing at least one of the first oxygen doping treatment and the second oxygen doping treatment.

15. The method for manufacturing the semiconductor device according to claim 9, further comprising the step of:
    performing a second heat treatment after forming the oxide semiconductor layer.

16. The method for manufacturing the semiconductor device according to claim 15, wherein oxygen is supplied to the oxide semiconductor layer from the base insulating layer by the second heat treatment.

17. The method for manufacturing the semiconductor device, according to claim 9, wherein the second oxygen doping treatment is performed by at least one of the ion implantation method, the ion doping method, and the plasma immersion ion implantation method.

18. The method for manufacturing the semiconductor device, according to claim 17, wherein the second oxygen doping treatment is performed by using a linear ion beam.

19. A method for manufacturing a semiconductor device comprising the steps of:
  forming a base insulating layer over an insulating surface;
  performing a heat treatment after forming the base insulating layer;
  performing an oxygen doping treatment to introduce an oxygen ion into the base insulating layer by at least one of an ion implantation method, an ion doping method, and a plasma immersion ion implantation method after the heat treatment;
  forming an oxide semiconductor layer over the base insulating layer after the oxygen doping treatment;
  forming a gate insulating layer over the oxide semiconductor layer; and
  forming a gate electrode layer over the gate insulating layer.

20. The method for manufacturing the semiconductor device, according to claim 19, wherein the oxygen ion comprises at least one of a molecular ion and a cluster ion.

* * * * *